US012581707B2

(12) United States Patent
Harel

(10) Patent No.: US 12,581,707 B2
(45) Date of Patent: Mar. 17, 2026

(54) DIAMOND WAFER BASED ELECTRONIC VEHICLE POWER ELECTRONICS

(71) Applicant: Diamond Foundry Inc., South San Francisco, CA (US)

(72) Inventor: Jean-Claude Harel, South San Francisco, CA (US)

(73) Assignee: Diamond Foundry Inc., South San Francisco, CA (US)

( * ) Notice: Subject to any disclaimer, the term of this patent is extended or adjusted under 35 U.S.C. 154(b) by 324 days.

(21) Appl. No.: 18/241,500

(22) Filed: Sep. 1, 2023

(65) Prior Publication Data

US 2023/0411459 A1      Dec. 21, 2023

Related U.S. Application Data

(63) Continuation of application No. PCT/US2022/026636, filed on Apr. 28, 2022.

(60) Provisional application No. 63/243,662, filed on Sep. 13, 2021, provisional application No. 63/233,616, filed on Aug. 16, 2021.

(51) Int. Cl.
| | |
|---|---|
| *H10D 62/83* | (2025.01) |
| *H01L 23/473* | (2006.01) |
| *H10D 12/00* | (2025.01) |
| *H10D 62/40* | (2025.01) |

(52) U.S. Cl.
CPC ..... *H10D 62/8303* (2025.01); *H01L 23/4735* (2013.01); *H10D 12/411* (2025.01); *H10D 62/405* (2025.01)

(58) Field of Classification Search
CPC .............. H10D 62/8303; H01L 23/367; H01L 23/3735; H01L 23/3736; H01L 23/3732; H01L 25/072
See application file for complete search history.

(56) References Cited

U.S. PATENT DOCUMENTS

| | | | |
|---|---|---|---|
| 10,692,752 B2 | 6/2020 | Kaplun et al. | |
| 2004/0245954 A1* | 12/2004 | Moench | B60S 1/0814 |
| | | | 318/443 |
| 2006/0158846 A1* | 7/2006 | Craft | H05K 7/20136 |
| | | | 361/689 |
| 2011/0223321 A1 | 9/2011 | Zimmer et al. | |

(Continued)

FOREIGN PATENT DOCUMENTS

| | | |
|---|---|---|
| DE | 102006040820 A1 | 3/2008 |
| EP | 0901166 B1 | 3/1999 |

(Continued)

OTHER PUBLICATIONS

Extended European Search Report dated Jun. 4, 2025 for European Patent Application No. 22858884.4.

(Continued)

*Primary Examiner* — Wasiul Haider
(74) *Attorney, Agent, or Firm* — JDI PATENT; Joshua D. Isenberg

(57) ABSTRACT

A power device electronics system includes a thermal management configuration in which a power electronics chip is attached to a copper substrate and a single crystal diamond substrate attached to the copper substrate. The copper substrate is sandwiched between a first side of the diamond substrate and the power electronics chip.

34 Claims, 28 Drawing Sheets

(56)          References Cited

U.S. PATENT DOCUMENTS

| | | | |
|---|---|---|---|
| 2012/0288698 A1* | 11/2012 | Moldovan ................ | C25D 1/00 |
| | | | 428/141 |
| 2013/0112993 A1 | 5/2013 | Hayashi et al. | |
| 2014/0061673 A1* | 3/2014 | Miyanagi ......... | H01L 23/49575 |
| | | | 257/77 |
| 2016/0013168 A1* | 1/2016 | Standing ........... | H01L 23/49838 |
| | | | 257/783 |
| 2016/0071781 A1* | 3/2016 | Sheridan ................ | H10D 84/86 |
| | | | 257/706 |
| 2017/0025337 A1* | 1/2017 | Padmanabhan ..... | H01L 21/4853 |
| 2020/0350233 A1 | 11/2020 | Mizerak et al. | |
| 2025/0174513 A1 | 5/2025 | Harel | |

FOREIGN PATENT DOCUMENTS

| | | | |
|---|---|---|---|
| JP | 5979478 B | | 8/2016 |
| WO | 2013087706 A1 | | 6/2013 |
| WO | 2019222458 A1 | | 11/2019 |
| WO | WO2019222458 | * | 11/2019 |
| WO | 2023022761 A1 | | 2/2023 |

OTHER PUBLICATIONS

Mokuno Y et al: "Synthesizing 1-30 single-crystal diamond by repetition of high rate homoepitaxial growth by microwave plasma CVD", Diamond and Related Materials, Elsevier Science Publishers Amsterdam, NL, vol. 14, No. 11-12, H01L1 Nov. 2005 (Nov. 1, 2005), pp. 1743-1746, XP027813468, ISSN: 0925-9635 [retrieved on Nov. 1, 2005].

"What is a Half Bridge Inverter: Circuit Diagram & its Working" Elprocus available at: https://www.elprocus.com/what-is-half-bridge-inverter-circuit-diagram-its-working/.

International Search Report & Written Opinion dated Jul. 28, 2022 for International Patent Application Number PCT/US2022/026636.

Azoulay Itsh'ak et al "Doping Type Influence on Physical Diamond Properties" Mater. Res. Express 9, IOP Publishing, 025901 (2022).

Crawford, Kevin G. et al. "Surface Transfer doping of Diamond: A review" Progress in Surface Science 96 100613. (2021).

Extended European Search Report dated Nov. 11, 2025 for European Patent Application No. 22904905.1.

* cited by examiner

Power Dissipation(W)     730

| | Material | Thermal Conductivity W/m.K | Surface (mm2) | Thickness (mm) | W/m.K | Rth | Delta T (K) |
|---|---|---|---|---|---|---|---|
| Rth1 | SAC305 | 58 | 75 | 0.02 | 217.50 | 0.0046 | 3.356 |
| Rth2 | Copper | 383 | 75 | 0.035 | 820.71 | 0.0012 | 0.889 |
| Rth3 | Interface Copper-Dielectric | 20 | 90 | 0.015 | 120.00 | 0.0083 | 6.083 |
| Rth4 | Dielectric | | | | | | |
| | IMS TCLAD | 7.5 | 90 | 0.15 | 4.50 | 0.2222 | 162.222 |
| | Al2O3 (Aluminum Oxyde) | 30 | 90 | 0.15 | 18.00 | 0.0008 | 40.556 |
| | AlN(Aluminum Nitride) | 90 | 90 | 0.15 | 54.00 | 0.0003 | 13.519 |
| | BEO(BerryliumOxyde) | 216 | 90 | 0.35 | 55.54 | 0.0006 | 13.143 |
| | | | | | | | |
| Rth5 | Interface Dielectric-Substrate | 20 | 90 | 0.015 | 120.00 | 0.0083 | 6.083 |
| Rth6 | Aluminum Substrate | 240 | 90 | 2 | 10.80 | 0.0926 | 67.593 |
| Rth7 | Interface Substrate-Heat Sink | 20 | 90 | 0.01 | 180.00 | 0.0056 | 4.056 |
| Rth8 | Interface Heat Sink Coolant | | | | | | |
| | Laminar Flow | 400 | 180 | 5 | 14.40 | 0.0694 | 50.694 |
| | Turbulant Flow | 600 | 180 | 5 | 21.60 | 0.0463 | 33.796 |
| | Thin Fins | 1200 | 800 | 20 | 48.00 | 0.0208 | 15.208 |

Total Delta (K)

| | Laminar Flow | Turbulant | Thin Fins | TJC @ 80C Coolant |
|---|---|---|---|---|
| IMS TCLAD | 301 | 284 | 265 | 345 |
| Al2O3 (Aluminum Oxyde) | 179 | 162 | 144 | 224 |
| AlN(Aluminum Nitride) | 152 | 135 | 117 | 197 |
| BEO(BerryliumOxyde) | 152 | 135 | 116 | 196 |

Fig. 3B

| Electrical/Thermal Considerations | | Switch Level | | System Level | | | | Vehicle Level | |
|---|---|---|---|---|---|---|---|---|---|
| | | Power Dissipation Switch (W) | Power Dissipation Rdson TDP Effect (W) | Inverter Power Losses to be Saved (W) (3 Switches Always ON) | Range Increases (miles) | Range Total (miles) | Range Increases (%) | Range Increases vs System Mass | Total Electrical + Mechanical |
| Pulse Current (A) | 565.00 | | | | | | | | |
| Estimated kW/Miles | 240.00 | | | | | | | | |
| Battery Capacity (kWh/h) | 50.00 | | | | | | | | |
| Start Pulse Rdson (mOh) @ 80C | 7.00 | 2235 | 0 | 0 | 0.00 | 208.3 | 0.00% | 0.536% | 0.536% |
| Stop Pulse Rdson (mOh) @ 100C | 8.50 | 2712 | 239 | 716 | 2.98 | 211.3 | 1.41% | 0.529% | 1.941% |
| Stop Pulse Rdson (mOh) @ 125C | 9.30 | 2969 | 367 | 1102 | 4.59 | 212.9 | 2.16% | 0.525% | 2.681% |
| Stop Pulse Rdson (mOh) @ 150C | 10.39 | 3315 | 540 | 1621 | 6.76 | 215.1 | 3.14% | 0.520% | 3.660% |
| Stop Pulse Rdson (mOh) @ 175C | 11.64 | 3716 | 741 | 2222 | 9.26 | 217.6 | 4.26% | 0.514% | 4.769% |
| Stop Pulse Rdson (mOh) @ 200C | 12.87 | 4109 | 937 | 2812 | 11.72 | 220.1 | 5.23% | 0.508% | 5.833% |

| Mechanical Considerations | | Miles per kgr | Variation (%) | Range (miles) | Gain in Range (miles) | Gain in Range (%) |
|---|---|---|---|---|---|---|
| Vehicle Mass (kgr) | 1850.00 | 0.1126 | 100.0000% | 208.33 | | |
| Inverter System Mass (kgr) | 12.00 | 0.1119 | 99.3555% | 206.99 | | |
| Diamond Based Inverter System Mass (kgr) | 2.00 | 0.1125 | 99.8920% | 208.11 | 1.12 | 0.54% |

Fig. 5

Thermal Path

Coolant Pressure Jets

Silicon Die (12C above Coolant)

Rth1 (Attachment)

Rth2 (Copper Layout)

Rth3 (Diamond Chip)

Rth4 (Interface Diamond-Coolant)

Power Dissipation(W)    730

| | Material | Thermal Conductivity W/m.K | Surface (mm2) | Thickness (mm) | W/m.K | Rth | Delta T (K) |
|---|---|---|---|---|---|---|---|
| Rth1 | Silver Sintering Attachment | 260 | 75 | 0.01 | 1950.00 | 0.0005 | 0.374 |
| Rth2 | Copper | 383 | 150 | 0.6 | 95.75 | 0.0104 | 7.624 |
| Rth3 | Diamond Chip | 1500 | 314 | 0.3 | 1570.00 | 0.0006 | 0.465 |
| Rth4 | Interface Heat Sink Coolant | | 314 | 0.5 | | | |
| | Cool Jet | 400 | | | 251.20 | 0.0040 | 2.906 |

| | |
|---|---|
| Total Delta (K) | 11.37 |
| TJC @ 80C Coolant | 91.37 |

DIAMOND WAFER BASED ELECTRONIC VEHICLE POWER ELECTRONICS

CLAIM OF PRIORITY BENEFIT

This application is a continuation of International Application No. PCT/US22/26636 filed Apr. 28, 2022 to Jean-Claude Harel. The entire content of which are incorporated herein by reference.

International Application No. PCT/US22/26636 claims the priority benefit of commonly-assigned, U.S. provisional patent application No. 63/243,662, filed 13 Sep. 2021, entitled "Diamond Wafer Based Electronic Vehicle Power Electronics", and U.S. provisional patent application No. 63/233,616, entitled "Diamond Wafer Based Electronic Vehicle Power Electronics", the entire disclosures of which are incorporated herein by reference.

BACKGROUND

Advancing Energy Efficiency in EV Power Electronics

The large majority of power inverters architecture consist of converting the DC voltage from the battery to a 3-phase AC format compatible with the electric traction motor. Today power conversion ranges from 50 to 250 kW (400 kW peak) depending on models. Years to come will see the emergence of MW systems (trucking industry, naval transportation, and more importantly the aerial e-mobility). Each phase requires two power switches mounted in a so-called "half bridge" topology. During operation, because the three-phases are shifted at a 120-degree angle, always two switches are closed (ON) simultaneously, the other four being open (OFF).

In order to evaluate the inverter efficiency, conduction losses are calculated from the voltage difference when the switch is closed multiplied by the current flowing into the switch, of course multiplied by $6(3\times2=6$ switches). The level of power losses generated is substantial, and designers always have tried to reduce it to increase driving range or battery size reduction. Some other considerations such as wire-bonds stress and capacity, gate-drivers performances and overall system size and cost are as well part of the equation when designing a power traction inverter. Eventually the rule of thumb to reduce power losses has been so far "use more silicon surface area or use a better heat sink". Both "recommendations" have large drawbacks. The consideration of using more silicon switches indeed reduces power conduction losses since the "ON" state current is shared among a greater number of switches therefore reducing the power to be dissipated, but the switching losses increase accordingly especially with IGBTs. The drawback is the exponential surface attachment to be used, the multiplication of weak links in the power path such as wire bonds, the disparity from dies to dies, the physical distance expansion leading to detrimental parasitic inductances and the difficulty to perfectly synchronize each die to their companion die, eventually ending with an unrequired complexity and a poor efficiency for the effort deployed. Cost consideration finished to prove this doctrine wrong.

Cooling strategy on the other hand has been an interest of experiments and R&D studies for many years. Rather than only focusing on silicon improvements, designers had a second sense that reducing operating temperature of the dies could be the path to power efficiency, cost reduction and greater reliability. Though that intuition is certainly correct, nowadays available materials to ensure a satisfying result is by far unreachable.

Because the electrical and thermal paths for power silicon are identical and both of substantial magnitude, it is extremely challenging to literally disconnect them to direct the thermal path to a liquid coolant that needs to be electrically isolated for safety reasons and the electrical path that needs to be as short and resilient as possible. That disconnection mechanism (the "dielectric") is accomplished through techniques and technologies illustrated in FIGS. 1A-1C that have not really evolved significantly over the past four decades achieving poor results despite being largely adopted.

FIG. 2 depicts a common architecture for a power device. Generally the device includes a silicon die 1 that is attached by an attachment 2 to a copper layout 3, which is thermally coupled to a coolant 6 via a substrate 4 and dielectric material 5. Electric current flows mainly laterally in the copper layout 3 but mainly vertically from the die 1 through the attachment 2, layout 3, substrate 4 and dielectric 5. Such an architecture is characterized by relatively poor two-dimensional vectorial thermal propagation in the in the thermal path between the silicon die 1 and the coolant 6. For example, if the coolant 6 is at a temperature of about 80° C., the die 1 is typically at a temperature of 175-200° C. due to thermal impedance in the thermal path. The common architecture of FIG. 2 can be decomposed by the simplified following thermal-impedance Rth model shown in FIG. 3A and summarized in the table shown FIG. 3, B.

FIG. 3 shows that thermal impedance (Rth) between the die 1 and the coolant 6 is spread into 3 main categories:

1) Dielectric material 5 (Rth4): With a large range of performances and characteristics, dielectric materials must ensure the best thermal conductivity achieving automotive isolation requirements in the order of 4 kV for 1 minute, dictating the material thickness therefore Rth.

2) Substrates and mechatronics (Rth2, Rth6, Rth8): Substrates offer mechanical robustness and die mountability as well as exposed surfaces ensuring the thermal continuity to the coolant through the inverter system (mechatronics).

3) Surfaces junction is the point of junction of different elements mounted together and can be categorized in 3 main groups:

a) Soldering or sintering diffusion (Rth1) that offer the best thermal conductivity depending on the material used, interface thickness and thermal conductivity.

b) Deposition coating of ceramics to metal (e.g., Al2O3 flame spray coating) inducing an inter-material interface with its own Rth (Rth3, Rth5) depending of porosity and penetration;

c) Pressure contact (Rth7) where 2 surfaces are pressed together to create a thermal path (often the electric path too). This type of interface is highly dependent on the pressure applied, coplanarity, roughness and geometries of the surfaces. It is usually of poor performance and degrades with time.

Though non-intuitive, liquid to solid surface contact (Rth8) is part of this category but is more stable and of better quality/performance depending on the strategy adopted. Laminar flow on a planar surface exhibits a reduced efficiency since only a few molecules at the coolant surface contact to solid will carry the calories to be extracted. The rest of the liquid does not participate actively in the cooling. Turbulent flow creates a greater surface contact area and more carriers but requires a special mechanism to be implemented leading to a greater use of material and system volume increases (i.e., thin fins). As seen above, the total Rth junction to coolant is more an agglomeration of material properties, techniques, and surface area than a single dimension issue. There is a substantial margin for progress.

BRIEF DESCRIPTION OF THE DRAWINGS

FIG. 3B is a table containing relevant values for calculation of the thermal impedance for an example prior art electrical/thermal path in the power device.

FIG. 5 is a table summarizing power conduction losses for a 3-phase 250 kW inverter system translated into a standard EV sedan range according to current power device standards

FIG. 8 is a table containing relevant values for calculation of the thermal impedance for an example electrical/thermal path power device.

DETAILED DESCRIPTION

Introduction

Figures 1A, 1B, 1C:
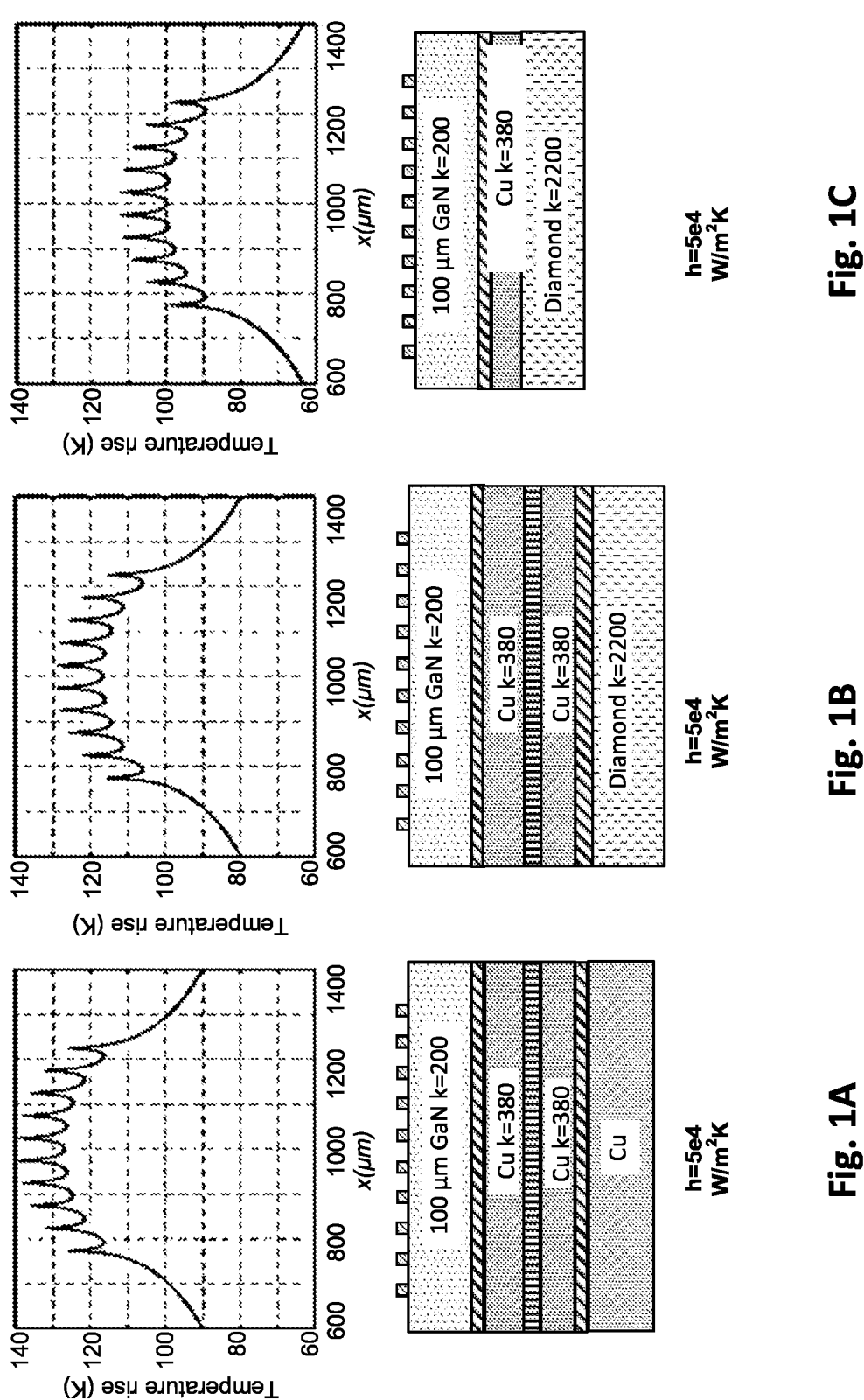
FIGS. 1A-1C depict thermal profiles and a side schematics view of different wafer types showing the General Impact of Adding Diamond to Power Electronics in prior art implementations.
Figure 2:
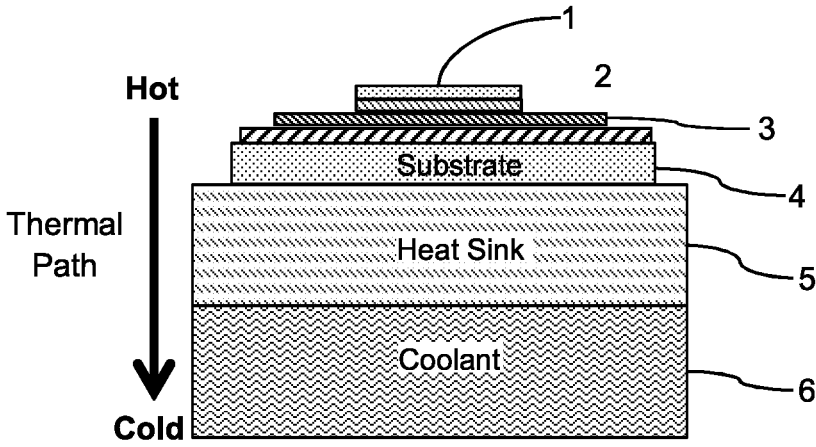
FIG. 2 depicts a cross section view of a prior art electrical/thermal path in a power device.
Figure 3A:
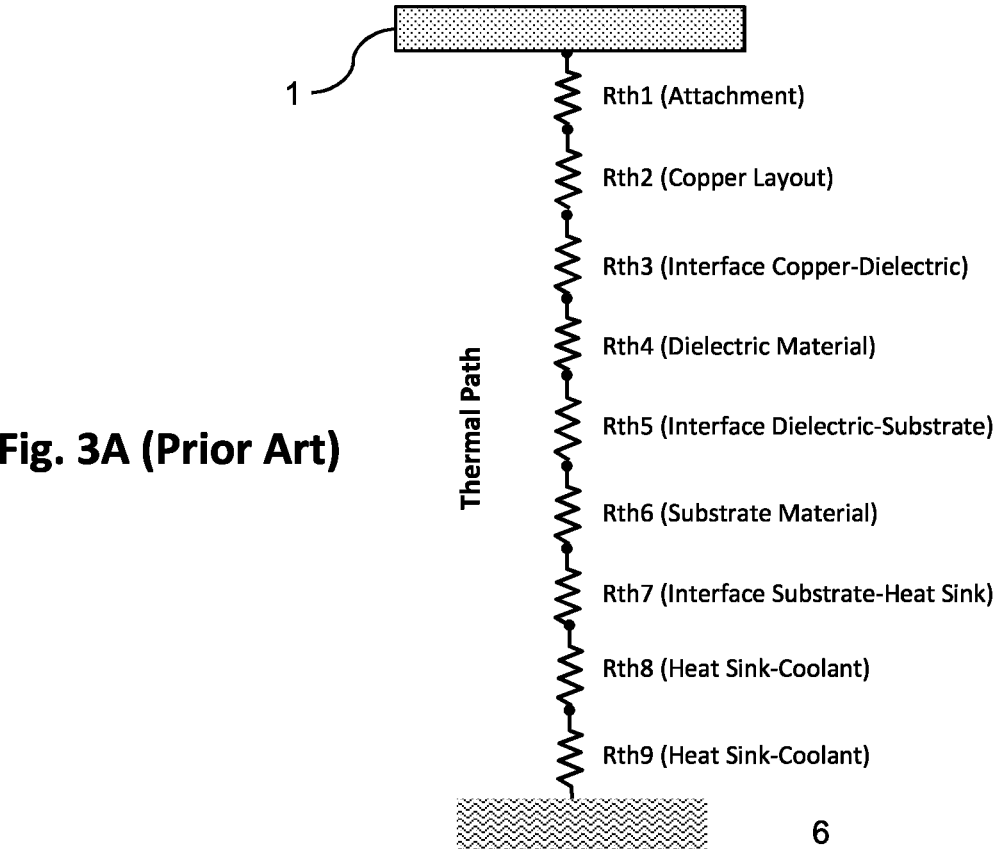
FIG. 3A is a thermal impedance Rth model representation of the prior art electrical/thermal path in a power device.

The advent and now proven volume scaling and cost reduction of Diamond Foundry's novel single-crystal diamond wafer enables significant advances in electric vehicle power electronics, improving driving range by up to 5.3% as well as lifetime well beyond 300,000 miles.

Overview

Electronic vehicle (EV) power electronics has increasingly become heat dissipation limited, and the potential range of electronics architectures has been limited by available materials. The thermal stress induced into power semiconductor switches has been a hard call to semiconductor and inverter companies, up to desperation. Engineers across the entire industry have been stuck using materials in their electronics design that do not truly meet the characteristics required for advancing EV power electronics, such in particular including a material that combines extreme thermal conductivity with extreme voltage insulation.

Single-crystal diamond (SCD) is a most extreme material—in multiple dimensions and by a decisive factor each—in particular through its combination of extreme thermal conductivity and extreme electrical insulation. SCD exhibits remarkable dielectric properties including a low dielectric constant of 5.7, a loss tangent below 0.0001 at 35 GHz and a high dielectric strength of MV/cm. This means 20 um of SCD can insulate 20 kV while at the same time delivering thermal conductivity as high as 3,000 W/mK.

Diamond Foundry, Inc. of South San Francisco, California has achieved production of single-crystal diamond in wafer dimensions covering the die sizes required by all commercially relevant computer and power-electronics chips.

The Power Traction Inverter Dilemma

An EV's Power Traction Inverter (PTI) is a critical element of electric mobility. Because of its level of complexity, electrical and thermal stress and eventually cost, PTIs have always been one of the weakest links of the electric mobility implementation, with a remarkable level of failure on the early development of this emerging market, and certainly a technological barrier of entry for OEM adoption. Driving conditions and style often induce substantial electrical and thermal stress to the active components of the inverter and their surrounding elements and if not properly addressed leads to drastic life reduction and eventually failures of the system.

Power inverter advancement has been slow and incremental due to complex design and manufacturing aggravated by custom subsystems requirements, sophisticated integration of high-power electronics, material science, mechatronics, and thermal management. Power density is certainly the key metric of performance for modern power inverters underscoring technology and efficiency. As a reference, state-of-the-art designs exhibit 33 kW/L (Tesla Model 3 is 12 L, 4.8 kg, 400 kW) and 36 kW/L (Audi e-Tron is 5.5 L, 8 kg, 200 kW).

Power semiconductors are essentially driven by two factors: Thermal conductivity—the path to cool them down— and electrical conductivity—the path to carry high currents. Though the electrical path has been worked on for many years with more or less success, the thermal path has always been the main challenge.

Besides the need for high thermal and electrical conductivity, power semiconductors need to be electrically isolated from the rest of the environment because they carry high voltages; this is a safety requirement. Unfortunately, voltage isolation barriers (like DBC substrates) usually demonstrate poor thermal conductivity. Common isolation barriers like high thermal conductivity compounds exhibit 2 to 5 W/mK, state of the art oxides such as Aluminum Oxide (Al2O3) show a 24 to 28 W/mK, more modern Aluminum Nitride (AlN) realistically offer 150 to 180 W/mK, therefore keeping a substantial undesirable thermal difference in between the semiconductor junction temperature (Tj) and the cooling mechanism (usually liquid glycol) at the thickness required to ensure electrical isolation.

Power semiconductors such as Silicon Insulated Gate Bipolar Transistors (Si IGBTs) and Silicon Carbide metal oxide semiconductor field effect transistors (SiC MOSFETs) have the same electrical and thermal path through their bottom side unlike other power dissipating devices such as MCU, logic, memory and DSP chips. Today's most common solution to ensure electrical insulation, and high current carrying capability for Si IGBT and SiC MOSFETs are Direct Bonded Copper (DBC) substrates. Unfortunately, they do not provide high heat carrying capacity.

Diamond Based Power Electronics

Because of its remarkable properties, diamond and diamond based solutions have always been on the far reaching scope of power semiconductors developers. Someone would call it the "Holy Grail" for semiconductors applications. This is the only known material in nature that exhibits ultra-high thermal conductivity and ultra-high band gap. Unlike graphene (another allotrope of carbon) which is electrically conductive, diamond is a premium isolator. Diamond Foundry now offers a practical and cost affordable solution to a very old issue: How to implement a cool down path efficiently to a power semiconductor and insure dielectric isolation at the same time.

The advantages of diamond have long been well-known, indeed this not being any surprise or novelty. What is new and disruptive is that Diamond Foundry has now managed to a. produce high-quality single-crystal diamond wafers for all chip die sizes; b. drive down cost to the levels required by automotive power electronics; and c. novel power electronics architectures that fully utilize the capabilities of novel diamond wafers.

Prior work by our team as well as other groups has shown that diamonds reduce peak temperature by as much as 20% for various semiconductors, such reduction improving power efficiency by 10% during such periods.

SCD wafers can be used close to the switching semiconductor device junction in multiple ways: replace ceramics (e.g., Aluminum Oxide (Al$_2$O$_3$), Aluminum Nitride (AlN), Silicon Nitride (Si$_3$N$_4$)) in direct-bonded-copper (DBC) substrates; replace heat spreaders in novel discrete packages; allow for thinning the semiconductor wafer. SCD wafers allow inverter size, weight, and cost reductions based on any and all semiconductor technologies, not requiring a "bet" on a novel form of a semiconductor gaining commercial traction.

The Importance of Sustaining a Lower Junction Temperature

The thermal stress induced into power semiconductor switches yields failure as well as energy efficiency loss. As a general rule of thumb, every 10° C. increase in temperature reduces the semiconductor life expectancy by half, setting for example the trend to higher-temperature resilient silicon designs to 200 C from 175 C for Silicon Carbide power switches. Unlike IGBTs who have an almost constant $V_{ce(sat)}$ versus temperature coefficient, MOSFET's (including SiC) RdsON is a Positive Temperature Depending Parameter (TDP) which means that RdsON increases with temperature.

Figure 4B:
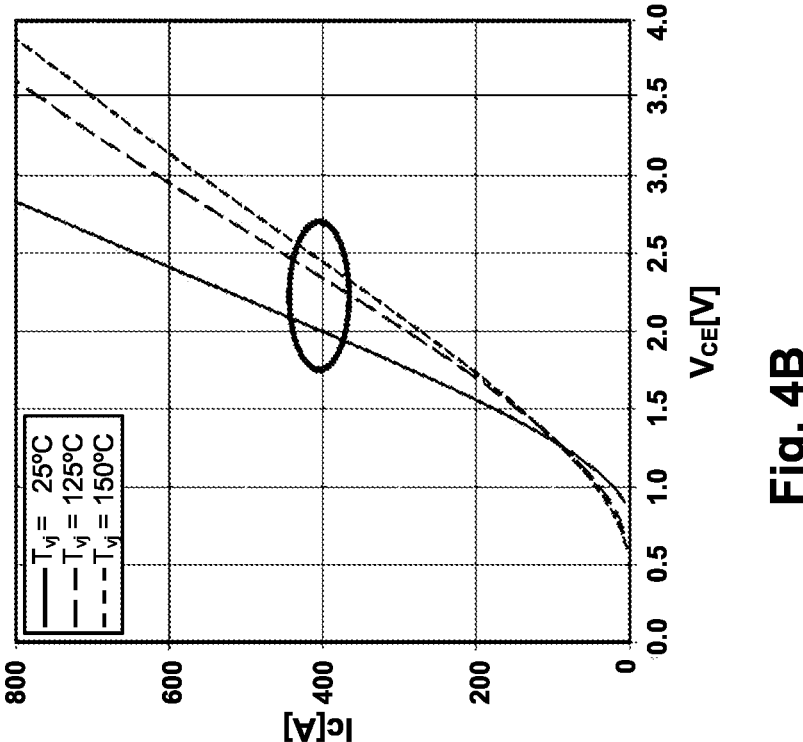
FIG. 4B is a line graph depicting the saturation voltage across the collector and emitter ($V_{CE(sat)}$) vs temperature for a typical IGBT device.
Figure 4A:
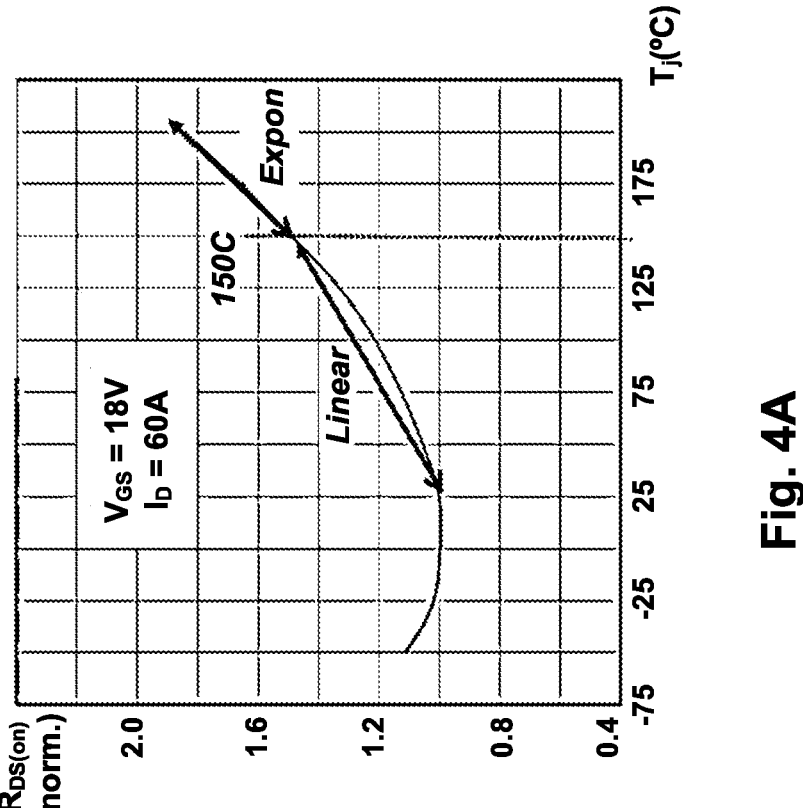
FIG. 4A is a line graph showing the normalized on-resistance (RdsON) versus temperature of a typical Silicon Carbide (SiC) power device.

FIG. 4A shows a normalized RdsON for a common SiC device. As the typical RdsON is specified at 25 C to be 1 (e.g., 7 mOhm) it increases 45% (10.39 mOhm) at 150 C, 64% (11.64 mOhm) at 175 C and 90% (12.87 mOh) at 200 C. The growth of RdsON vs Tj is split into the linear (25 to 150 C) and the exponential region (150 to 200 C) meaning that for the same amount of current (400 A), the power conduction losses will be 1120 W at 25 C, 1359 W at 100 C, 1662 W at 150 C, 1863 W at 175 C and 2060 W at 200 C.

FIG. 4B shows the $V_{ce(sat)}$ for a typical modern IGBT. Conduction losses at 400 A establishes at 800 W at 25 C, 920 W at 125 C and 1000 W at 150 C (no further data available). At the EV's inverter frequency operation (15 kHz), conduction losses represent about 60% of the cumulated conduction-switching losses of the device. This is mainly due to the so called "tail effect" of IGBT's and it is directly related to the surface area of the silicon chip. The greater the surface, the bigger the switching losses. Total cumulated conduction and switching losses for IGBTs establishes then to 1375 W at 25 C, 1580 W at 125 C and 1720 W at 150 C. It is remarkable that despite a very slim efficiency advantage to SiC vs IGBTs, the trend of adoption towards SiC is unreversible even the predominant cost of SiC vs IGBTs (about 5x) underscoring that implementation cost is undermined in favor of performances and EV's range gain.

Since onboard EV's coolant temperature is set to be 80 C as a standard, the challenge here is to keep the Tj as close as possible to coolant to eliminate the unnecessary conduction losses induced by the Tj in the exponential region and part of the linear region too for SiC and allow for a die surface area reduction for IGBTs. Bipolar structures such as IGBTs are quite resilient in respect of forward current as long as temperature dependency latch up conditions are not triggered. It is generally admitted that current density of up to 1000 A/cm2 set the limit and IGBTs manufacturer stay usually in the 80 to 90% of this limit over the temperature range. Mastering the junction temperature for IGBTs under the latch up condition enables a substantial die size active area reduction proportionately impacting the switching losses that IGBTs have been suffering since inception. Properly applied thermal management solutions such as Diamond Foundry solutions could see the equalization of modern SiC and antique IGBTs technologies for E-Mobility frequency switching range (10-20 kHz) at the ⅕ of the cost. Specific Impact on EV Driving Range FIG. 5 summarizes the power conduction losses for a 3-phase 250 kW inverter system translated into a standard EV sedan range according to nowadays standards. The 400 A per phase current (565 A peak) induced losses are studied across 80 C (coolant) to 200 C Tj.

The "Inverter Power Losses to be Saved" column shows the energy to be saved from the battery at various Tj, and the range is calculated accordingly from the battery capacity. Assuming the power switches Tj can be kept near by the coolant temperature (80 C) the total power losses saving could reach up to 2812 W per battery charge or 11.72 miles or 5.33% range increase.

This study is conservative in that it does not take in consideration the regenerative power saving which is estimated to be 15-20% of these figures. This includes power losses temperature dependency in Fast Recovery Diodes (FRD) associated to IGBTs, thermal dependency losses of the SiC MOSFET intrinsic diodes (which exhibit poor performances vs temperature) and the reduction of associated circuitry such as gate driver and collateral components. Size reduction in such proportion open the possibility to a direct integration inverter-motor eradicating power losses in cables length and terminals accounting for another few fractions of percent of the battery capacity.

Beyond Temperature: Enabling Single-Form Factor Architecture for EV Power Electronics Combining the extraordinary thermal-conductivity, voltage-insulation, and wafer-finish properties of single-crystal diamond wafers, now available from Diamond Foundry, novel device and system designs as well as more efficient assembly processes are enabled that the industry has not yet had the opportunity to pursue for GaN, SiC and IGBTs silicon chips.

In particular, Diamond Foundry's SCD wafer enables single-form-factor power inverters to exceed 1000 kW/L (e.g., 400 kW for a 0.4 L system). This comes with a greater system efficiency, losses and system cost reduction translating into energy saving and electric mobility range extension.

Figure 6:
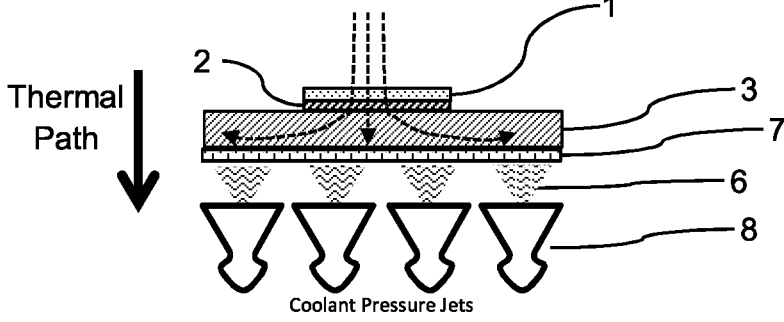
FIG. 6 is cross section view of the improved Thermal-Electrical path power devices according to aspects of the present disclosure.

A novel thermal management configuration according to aspects of the present disclosure is shown in FIG. 6. This configuration delivers a drastic reduction of the thermal impedance elements from nine to four elements. In this configuration, a semiconductor die 1 is attached to a copper substrate 3 by a silver attachment 2. The copper substrate 2 is diffusion bonded to a SCD wafer 7. Diffusion processes used for attachment in between the simplified number of elements constituting the thermal path are now reduced to nanometer scale insuring a free thermal propagation from the semiconductor die 1 through the diamond chip 7 to the coolant 6. The use of the SCD wafer 7 allows for a more three-dimensional thermal propagation, as indicated by the dashed arrows.

Figure 7:
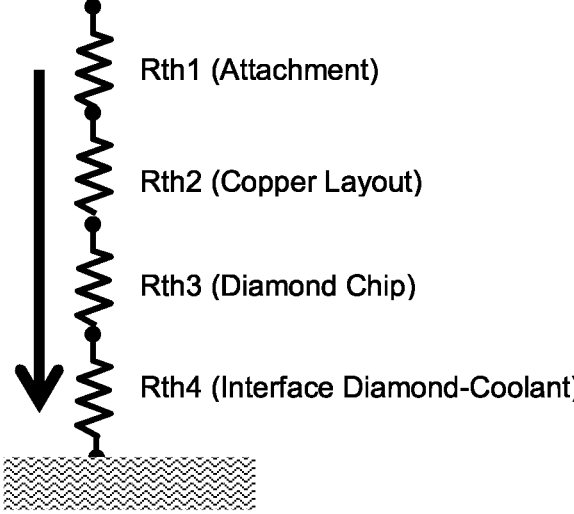
FIG. 7 is a thermal impedance Rth model representation of the improved electrical/thermal path power device according to aspects of the present disclosure.
Figure 9:
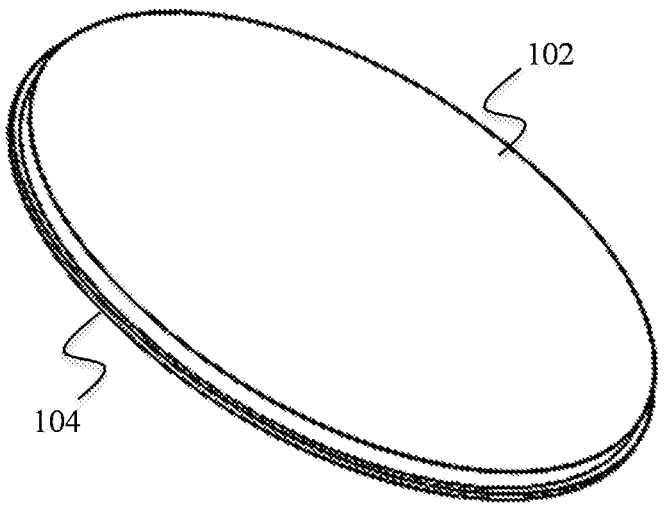
FIG. 9 is a three-quarter view of a substrate during the method of fabrication of the improved thermal-electric path power devices according to aspects of the present disclosure.

One or more pressurized coolant jets 8 deliver coolant 6 to the exposed surface of the diamond wafer 7, offering a perpendicular-impact flow yielding greater performance than laminar, turbulent, or turbulent "thin fins" solution. The corresponding thermal impedance model depicted in FIG. 7 in the table depicted and FIG. 8 summarize these advantages.

Because the dramatic reduction of total Rth (0.0155 from state of the art ~0.11) the silicon die Tj is now intimately related to the coolant temperature in a lockdown position creating a Tj "clamp" at around 12 C above the coolant enabling significant saving in conduction losses compared to those described with respect to FIG. 5, optimization of mechanical geometries for the inverter design and the reduction of needed active silicon die surface.

The advanced material and thermal management technology of a configuration like that of FIG. 6 offers a drastic reduction in thermal impedance and inverter size reduction paving the way to substantial EV's range extension, cost reduction and extreme reliability. Furthermore, this technology is scalable and adaptable to similar markets where high power efficiency and reliability is mission critical (i.e. power generation, charging station, grid balancing etc. . . . ).

Example Implementation 400 kW Power Inverter Design Introduction:

1) Single Switch Description

Figure 10:
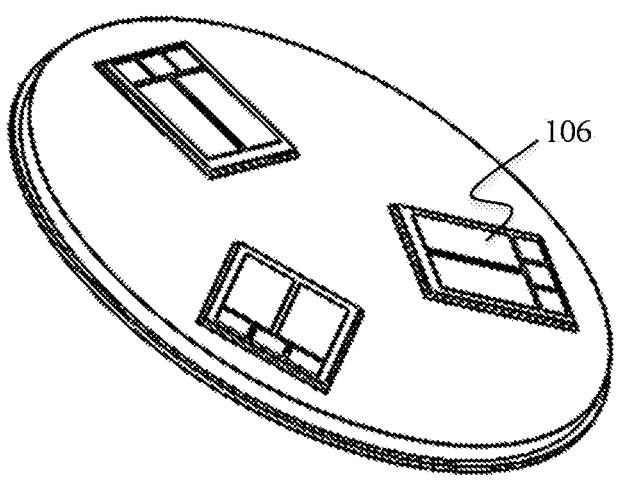
FIG. 10 is a three-quarter view of transistors attached to the surface of the substrate during the method of fabrication of the improved thermal electric path power devices according to aspects of the present disclosure.

In this example, single switch construction starts with, a 19.5×0.6 mm silver (Ag) plated copper Top substrate 102 attached to a 20×0.3 mm SCD chip 104. Next, as shown in FIG. 10, three transistors, e.g., IGBTs or MOSFETs are attached to the top substrate, e.g., using Ag sintering technology.

Figure 11:
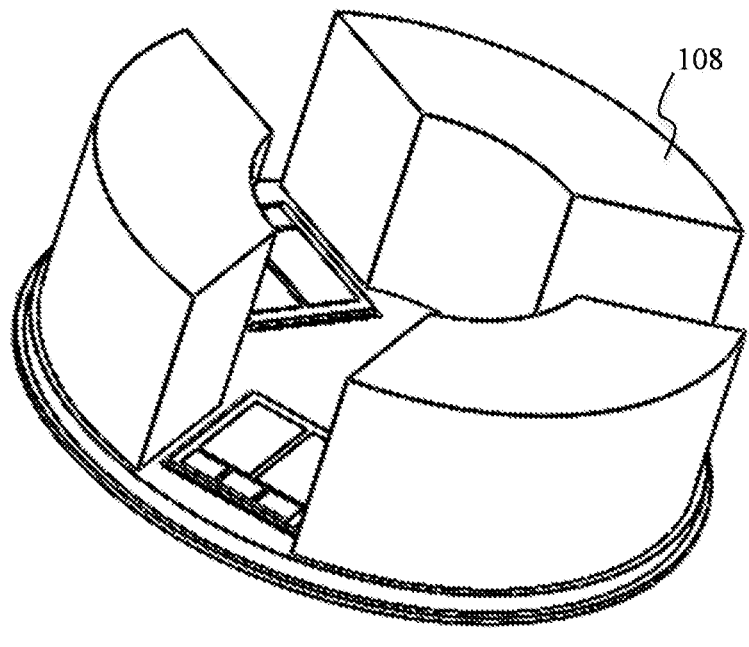
FIG. 11 is a three-quarter view of electrically conductive pillar structures coupled to the substrate between the transistor devices during the fabrication of the improved thermal-electric path power devices according to aspects of the present disclosure.
Figure 12:
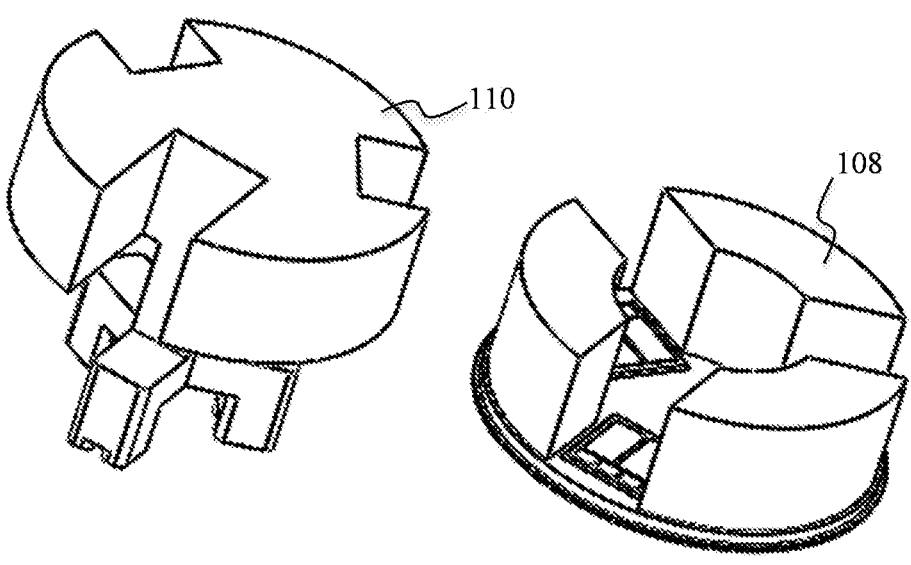
FIG. 12 is a side by side, three quarters view depiction of an electrically conductive clip and the substrate having conductive pillars during the fabrication of the improved thermal-electric path power devices according to aspects of the present disclosure.

By way of example, and not by way of limitation the MOSFETs 106 may be 130 A 1200V silicon carbide (SiC) MOSFET devices formed on 8×8 mm silicon chips. Next, as shown in FIG. 11, three electrically conductive pillar structures 108 for the High Current Power Path (V L translator) for the MOSFETs Drain connection are attached to the top substrate. By way of example, and not by way of limitation, the pillar structures may be 6 mm width Ag Plated Copper pillars. Next, as shown in FIG. 12, an electrically conductive, e.g., copper, clip 110 is mounted on top of the three SiC MOSFETs and sintered forming the High Current Power Path for the MOSFETs source connection.

Figure 13:
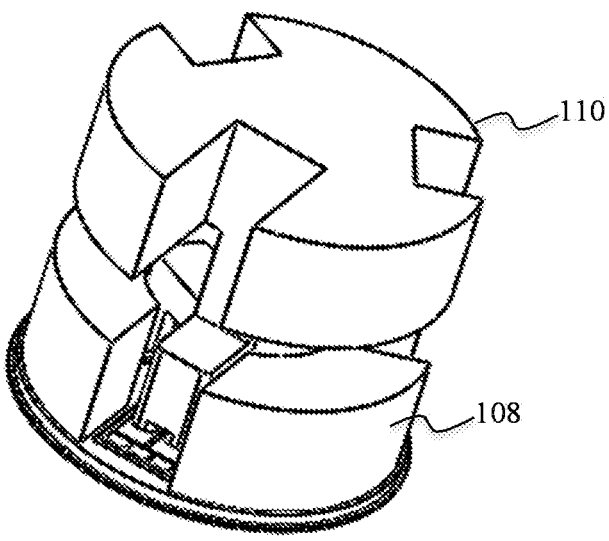
FIG. 13 is a three-quarter view depicting the conductive clip mounted and attached to the transistors on the substrate during the fabrication of the improved thermal electric/path power devices according to aspects of the present disclosure.
Figure 14:
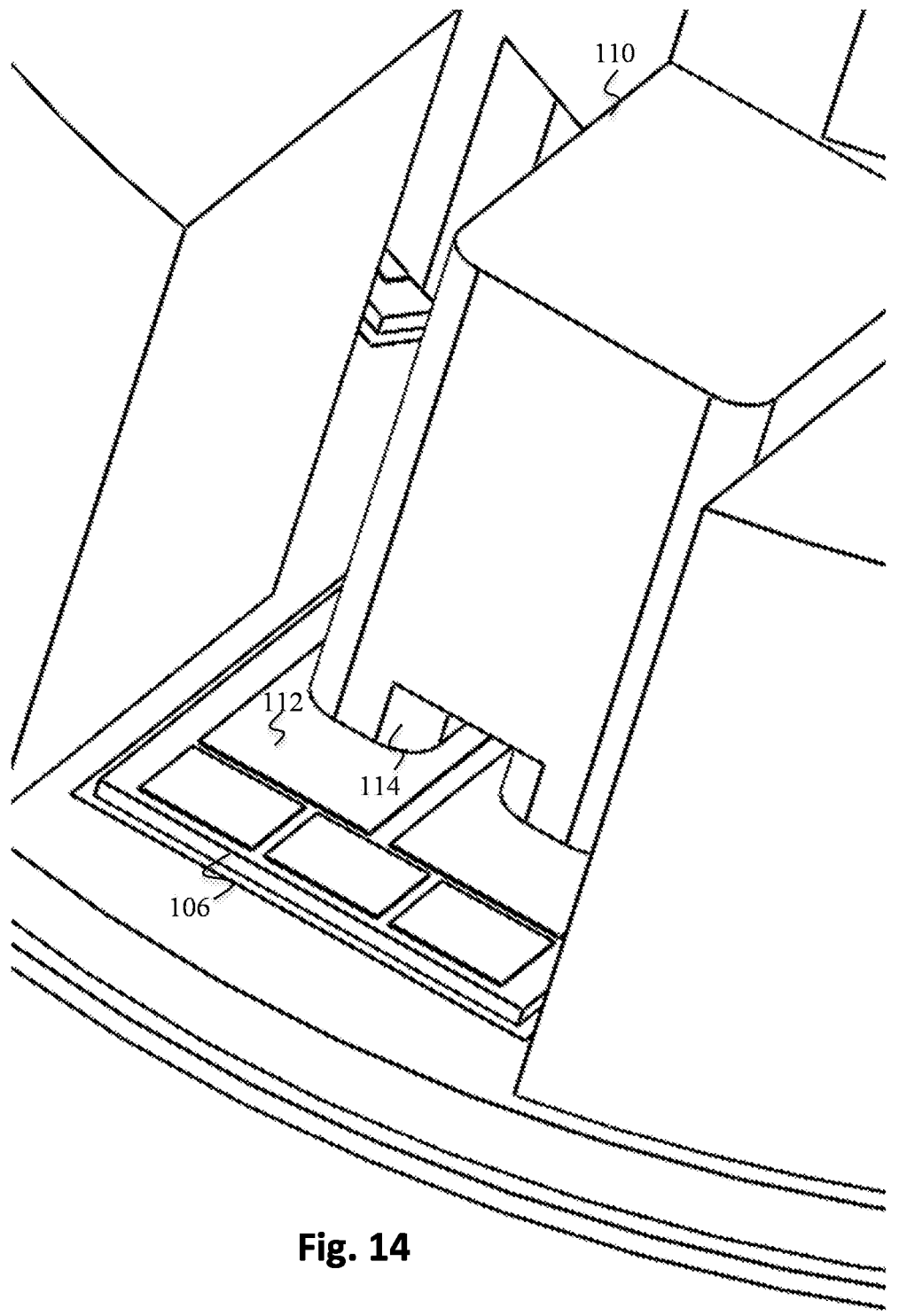
FIG. 14 is a cut-away three-quarter view showing the mounting and attachment of the conductive to the transistors during the fabrication of the improved thermal-electric path power devices according to aspects of the present disclosure.
Figure 15:
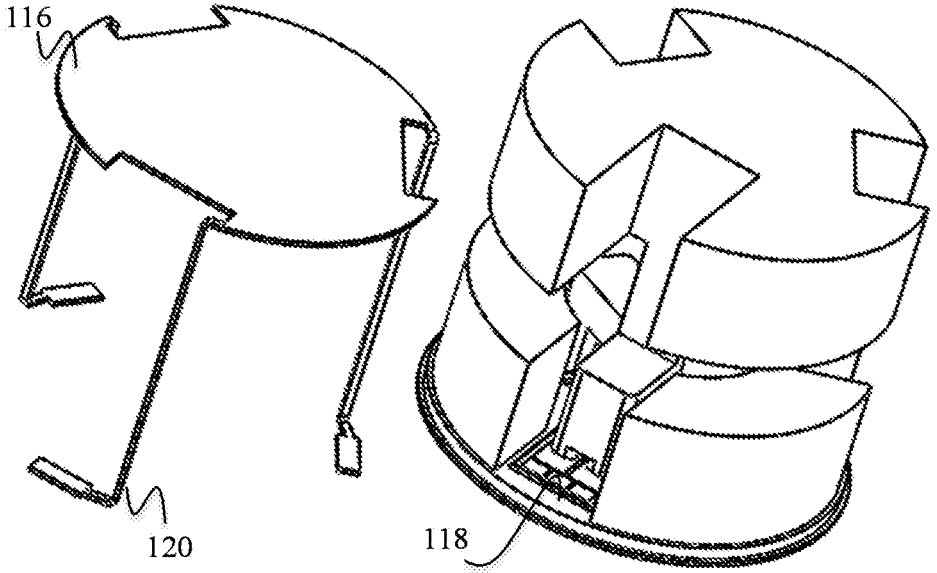
FIG. 15 is a side-by-side three quarter view showing a thin flex printed circuit board(PCB) for gate connections and the substrate-clip assembly during the fabrication of the improved thermal-electric path power devices according to aspects of the present disclosure.
Figure 16:
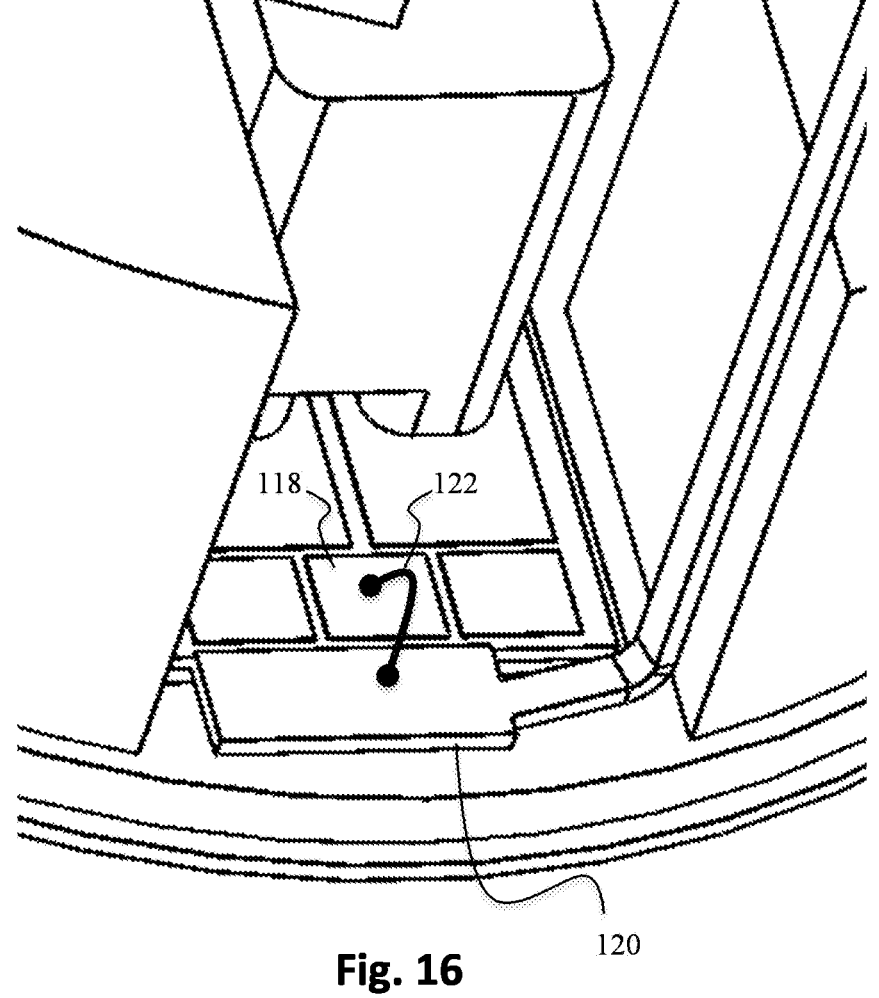
FIG. 16 is a cut away three-quarter view depicting the formation of a bond-wire to the thin flex (PCB) and get pad of a transistor during the fabrication of the improved thermal-electric path power devices according to aspects of the present disclosure.
Figure 17:
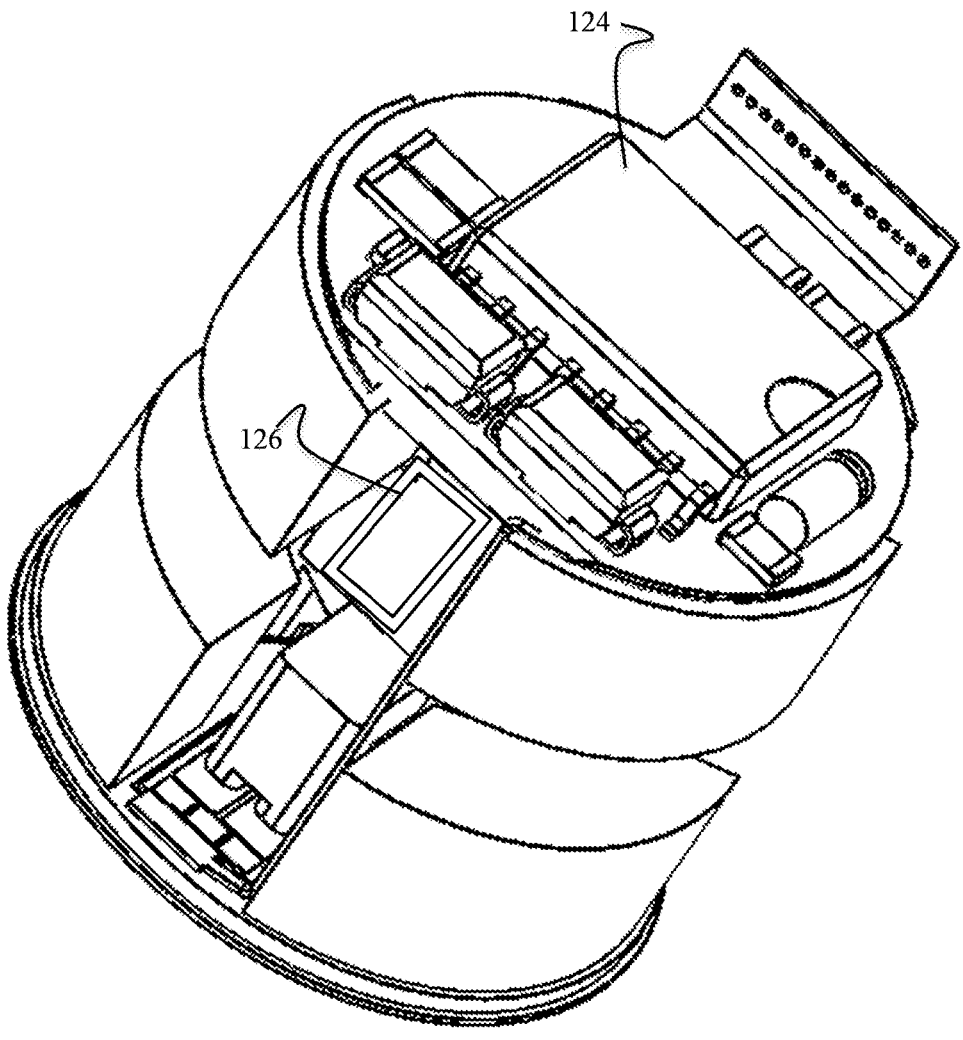
FIG. 17 is a cut-away three-quarter view showing gate driver, control, and sense circuitry mounted on the thin flex PCB coupled to the substrate-clip assembly during the fabrication of the improved thermal-electric path power devices according to aspects of the present disclosure.
Figure 18:
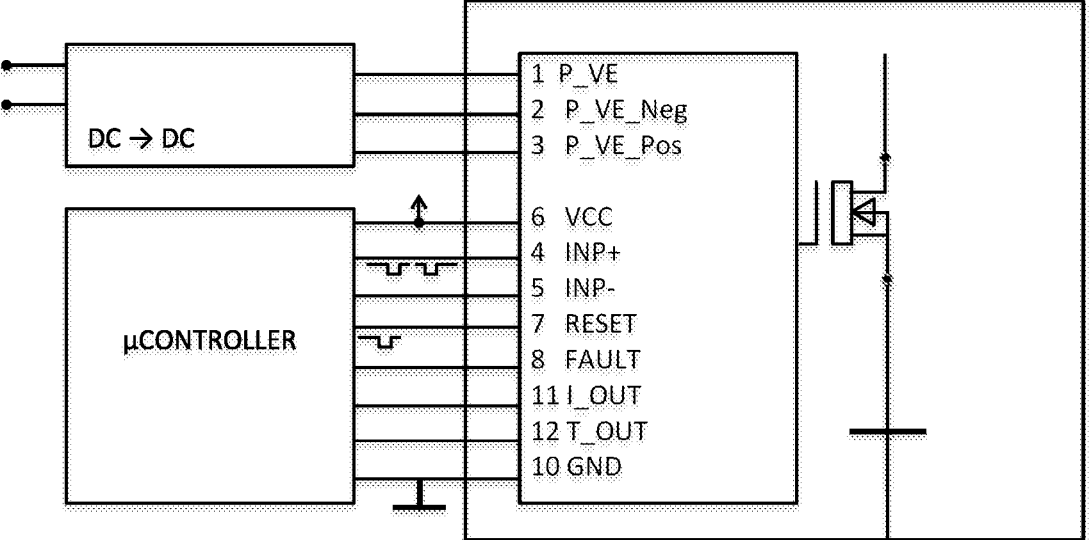
FIG. 18 is circuit diagram depicting an example gate control circuit layout on thin flex PCB according to aspects of the present disclosure.

As shown in FIG. 13, the clip is mounted and attached to the MOSFETs Source Pad connection, e.g., using sintering technology. Electrical connection to the MOSFETs 106 may be made by sintering top pads 112 on the MOSFETs to corresponding projections 114 on the clip 110, as shown in FIG. 14. A thin flex printed circuit board (PCB) 116 is installed to form a gate router for the MOSFETs' gate connections 118, as shown in FIG. 15. Conductive extensions 120 on the PCB 116 are electrically connected to the gate connections 118, e.g., by wire bonds 122, as shown in FIG. 16. Thin flex PCB gate driver circuitry 124 and a current sense circuit 126 are added and interconnected with the Gate router 116, as shown in FIG. 17. The corresponding device as an equivalent schematic in FIG. 18.

Figure 19:
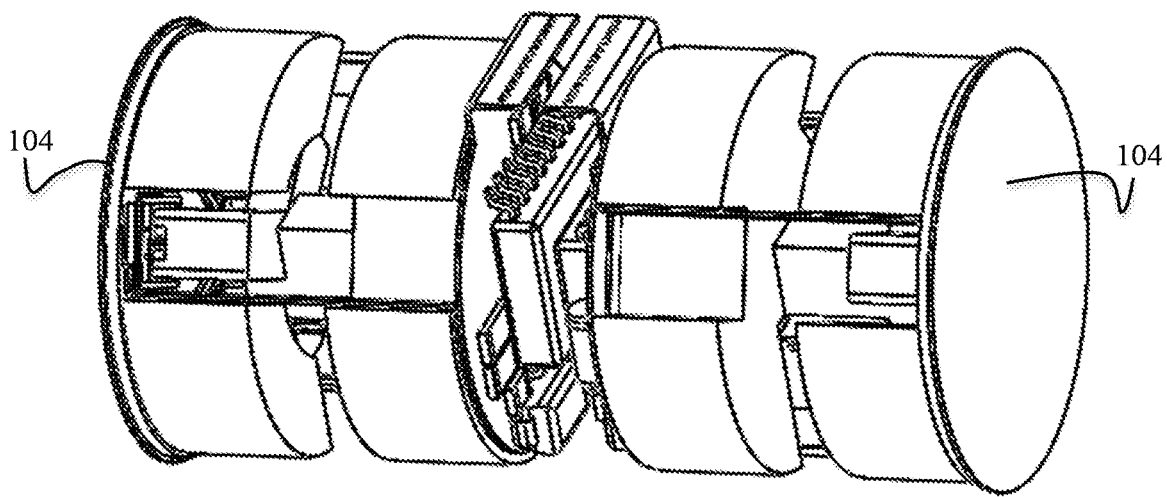
FIG. 19 is diagram depicting two improved thermal-electric path power devices aligned in back-to-back configuration creating an improved half bridge device according to aspects of the present disclosure.
Figure 20:
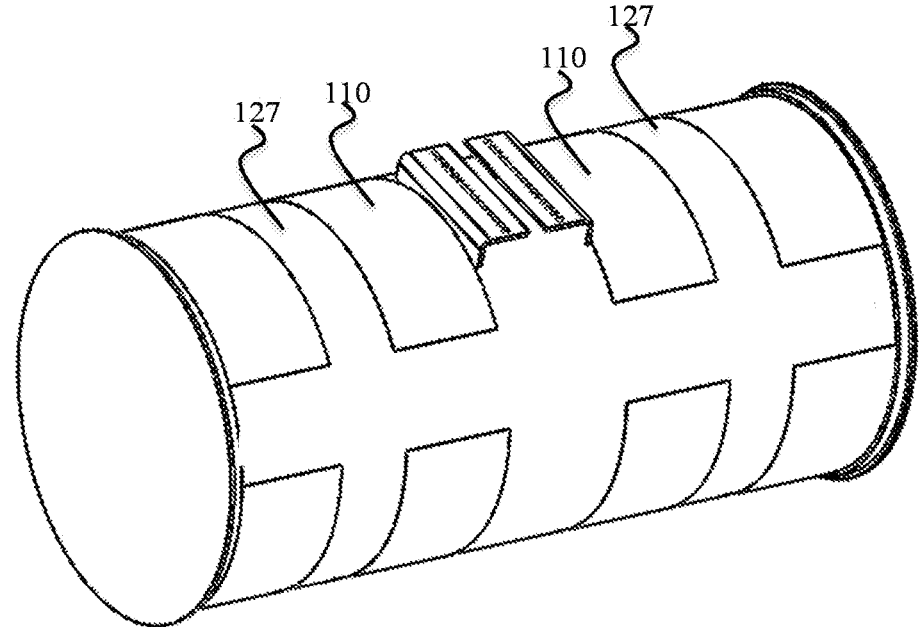
FIG. 20 is a diagram depicting formation of epoxy compound in areas of the improved half bridge device according to aspects of the present disclosure.

Subsequently, two identical structures of the type shown in FIG. 17 may be aligned back to back with the SCD chips 104 facing outward, as shown in FIG. 19 and then epoxy compounded 127, as shown in FIG. 20. The epoxied device shown in FIG. 20 may be used in half bridge inverter or for single direction motor control a, so-called Half-H bridge. The sources 110 of each side of the device may be connected in anti-parallel. Each side of the device may also be connected in parallel with a diode to shunt reverse flow of current. The half bridge device may also be integrated into switch mode power supplies using synchronous rectifiers.

Two of the half bridge inverter devices may be arranged together to create a full H-bridge for motor control or as a power converter, such as an AC-to-AC converter, DC-to-DC converter, or DC-to-AC converter.

Figure 21:
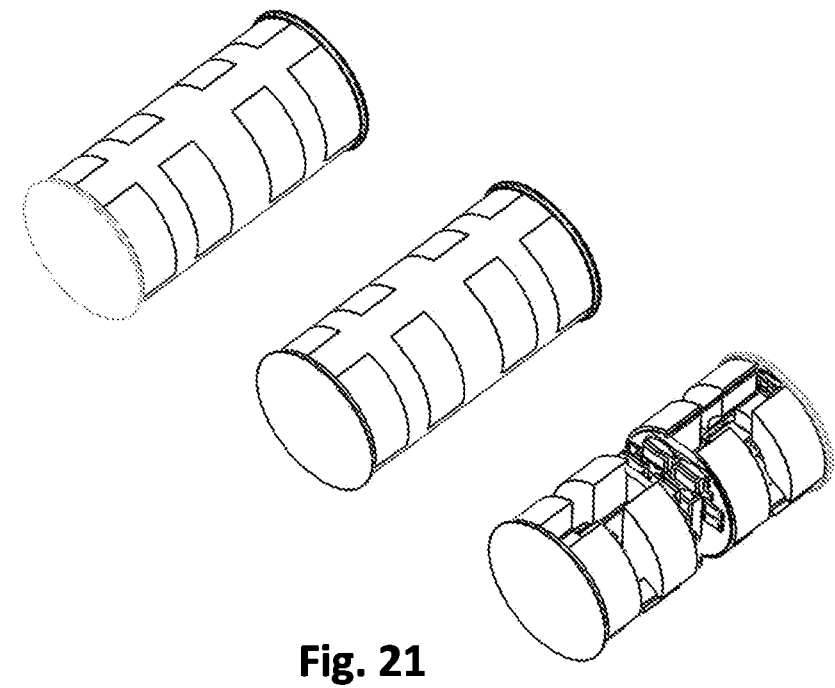
FIG. 21 is a diagram depicting three improved half bridge devices arranged in parallel configuration according to aspects of the present disclosure.
Figure 22:
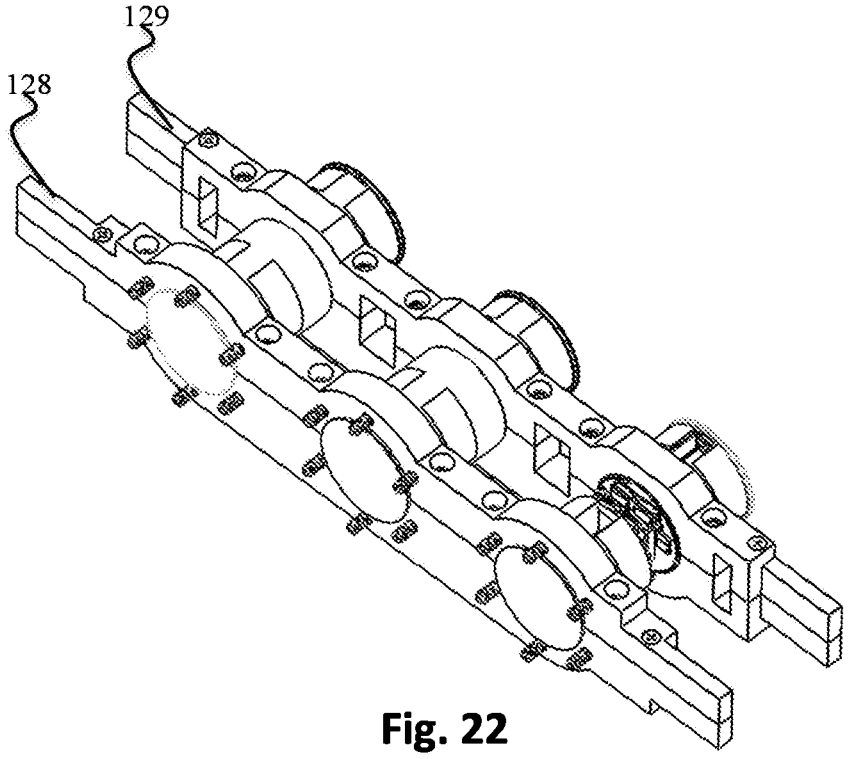
FIG. 22 is a diagram depicting bus bars rigidly connecting the three improved half bridge devices in a parallel configuration according to an example of the present disclosure.
Figure 23:
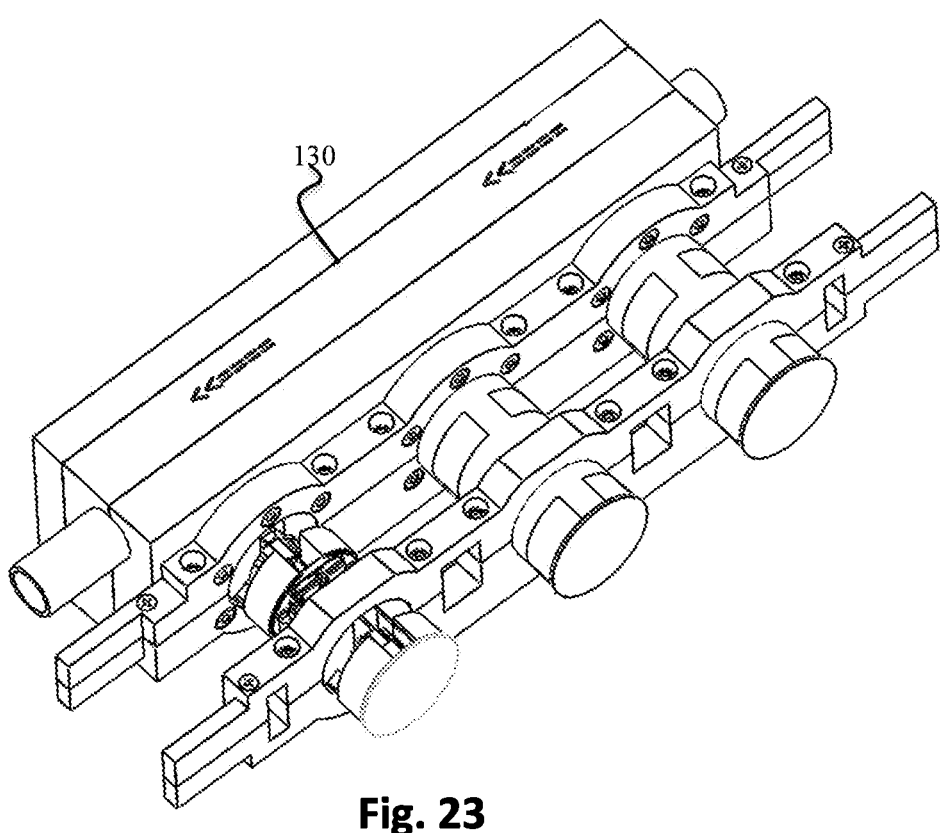
FIG. 23 is a diagram depicting a cool jet coolant block mounted to the three improved half bridge devices connected via the bus bar according to aspects of the present disclosure.

Three half bridge devices may be arranged in parallel as shown below in FIG. 21 to create a three-phase inverter device. Each device is aligned with the gate controls located between the source regions for either side of each half bridge device. This parallel arrangement allows short distance rigid connections to be formed between each of the half bridge devices. The three half bridge devices of the type shown in FIG. 21 may be rigidly connected such as via bus bars 128, 129, as shown in FIG. 22. For the three-phase inverter device the drains of each of one side of the three half bridge devices 128 may be connected and the sources on the other side of each of the half bridge devices may be connected 129. The ridged bus bar 128 may form the VBUS (+) bus bar for the three-phase power inverter and the ridge bus bar 129 may form the VBUS (−) bus bar for the three-phase power inverter. The bus bars provide both an electrical connection between half bridge devices and structural rigidity.

Figure 24:
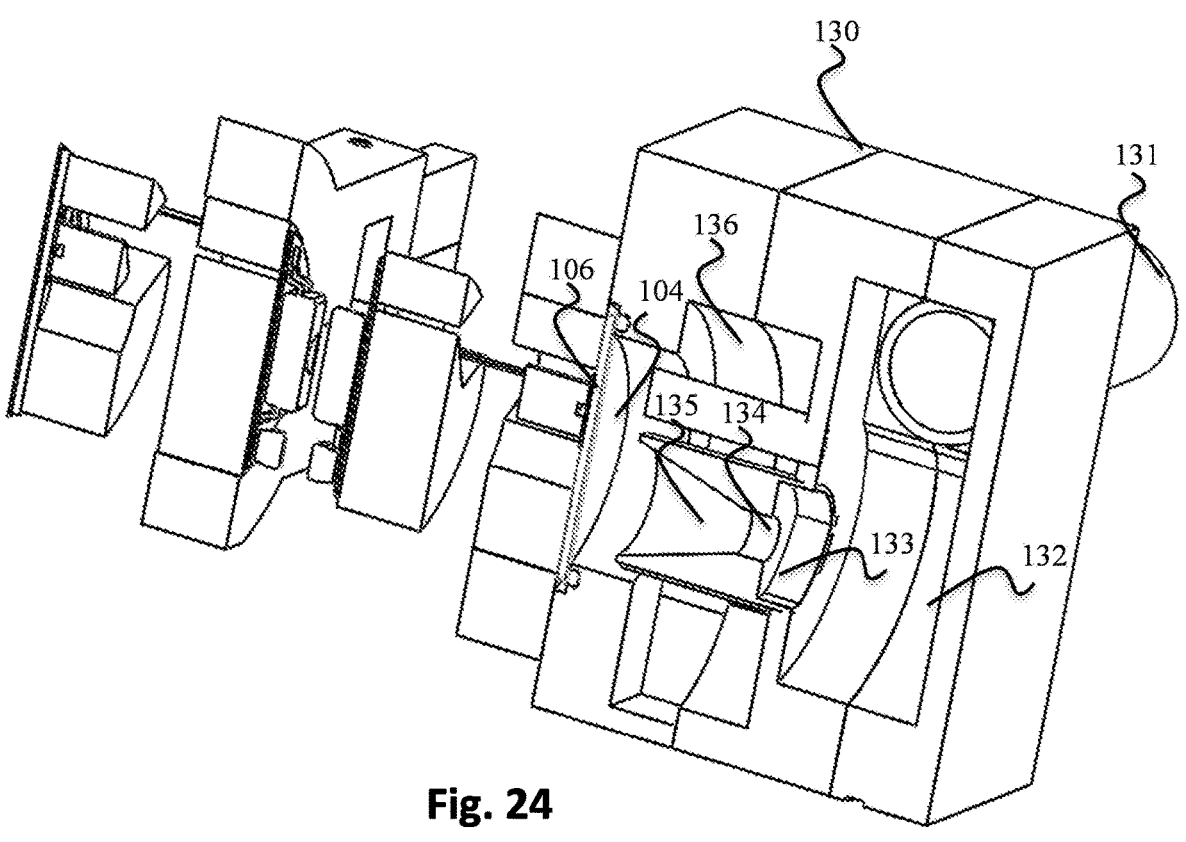
FIG. 24 is a cut-away side view of an improved half bridge device mounted to the cool jet coolant block according to aspects of the present disclosure.
Figure 25:
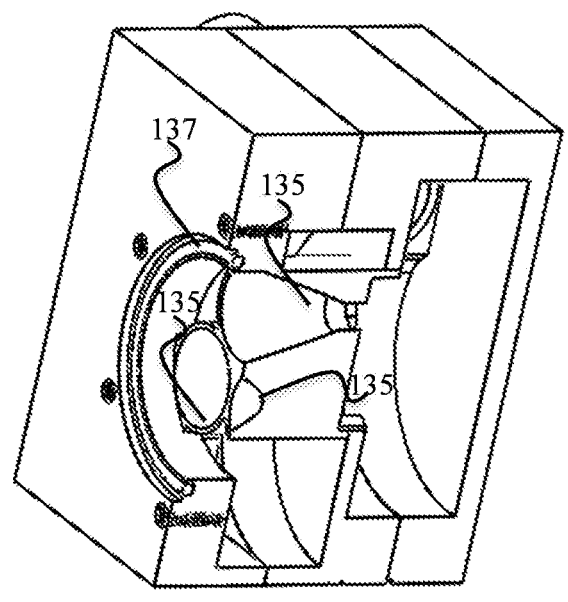
FIG. 25 is a cut-away view of a single cool jet cooling block according to aspects of the present disclosure.

The single crystal diamond chip (SCD) 104 allows for efficient cooling of the MOSFETS in each half-bridge device. Cooling blocks 130 may be coupled to each side of the three-phase inverter device as shown in FIG. 22. Each of the half bridge devices may include cooling fins for radiative cooling or a fluid interface for liquid or evaporative cooling. The cooling block 130 may be implemented as a cool jet coolant block to provide improved thermal conduction between the coolant and the SCD surface. The cool jet coolant block as shown in FIG. 24 uses the venturi effect to jet spray coolant onto the SCD surface creating a high flow rate and a high amount of contact between the cooling liquid and the SCD. As shown the coolant enters the cooling block 130 at the cooling intake port 131. Coolant fills the coolant intake cavity 132 reaching the compression chamber 133. The coolant increases velocity through the venturi 134 and spreads out along the surface of the bell nozzle 135 creating a coolant jet plume that hits the SCD 104. The coolant jet plume may be directed to areas of the SCD 104 that are under a MOSFET 106. Coolant disperses over the SCD 104, moving heat away from the MOSFET 106 and SCD 104. The hot coolant cycles up through the return cavities 136 where it may exit the cooling block 130 and may be cooled before returning to the coolant intake 131. The coolant may be cooled via expansion and radiative cooling through a radiator and fin block.

The cooling block 130 may include multiple bell nozzles 135 for example and without limitation, one for each of the MOSFETs 106. As previously discussed, each nozzle 135 may be located such that it is directly behind one of the MOSFETS and directs a jet flow of coolant onto the SCD 104 directly behind the MOSFET. A coolant O-ring seal 137 may prevent the escape of coolant from around the SCD 104.

Figure 26:
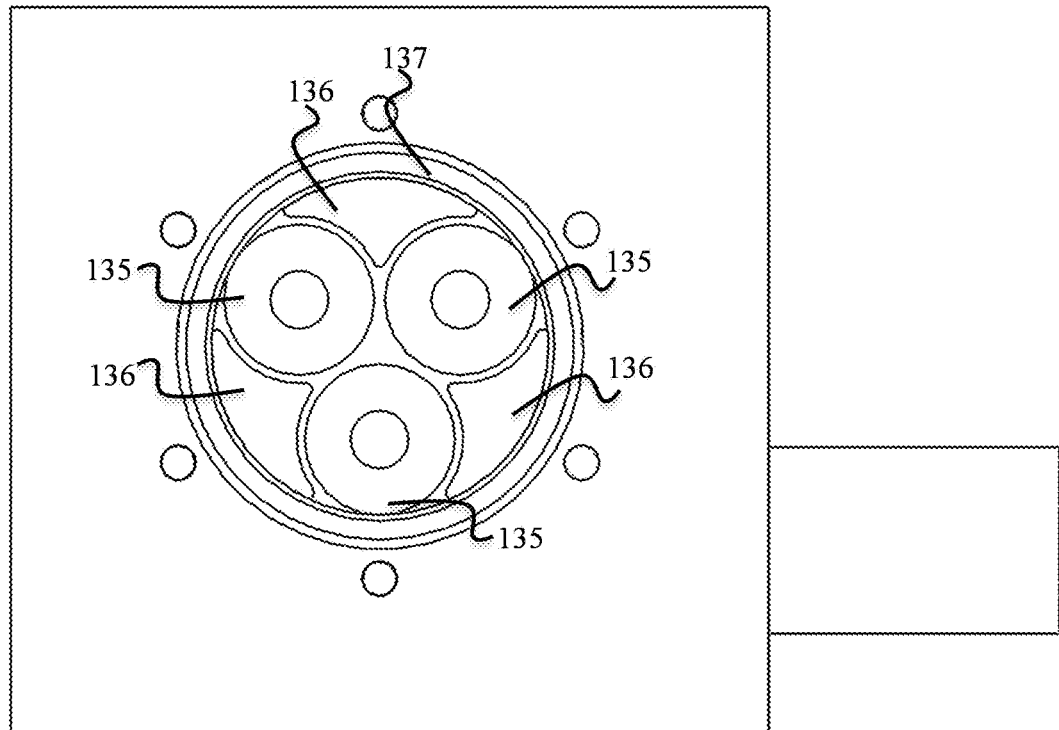
FIG. 26 is a cut-away view of the side of the cool jet cooling block mounted facing the half bridge device according to aspects of the present disclosure.
Figures 27, 28:
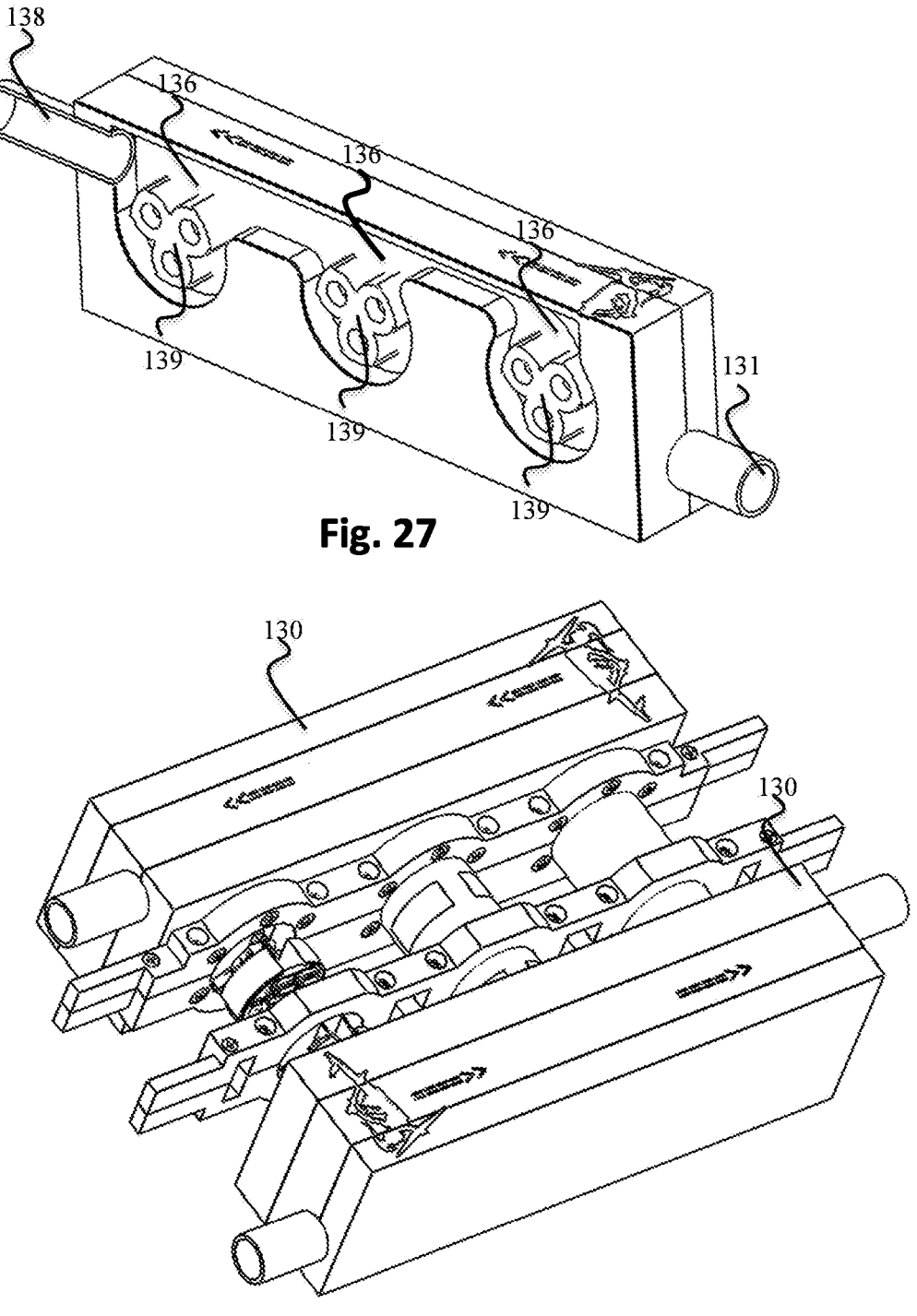
FIG. 27 is a cut-away side view showing the return side of the cool jet cooling block according to aspects of the present disclosure.
FIG. 28 is a diagram showing two coolant blocks, one mounted to each side of the three-phase power inverter according to aspects of the present disclosure.

The front view of FIG. 26 below depicts a view of the side of the cooling block that is mounted facing the three-phase inverter. As shown the cooling block may include three bell nozzles 135 each nozzle configured to behind one of the three MOSFETs of the half bridge device. The return cavities 136 may be located in the space between the bell nozzles 135. FIG. 27 shows a cutaway view of the return side of the cooling block according to aspects of the present disclosure. As shown this coolant block includes three nozzle assemblies 139 which are coupled together to cool the three-phase inverter. Coolant blocks may include any number of nozzles assemblies sufficient to cool inverter devices including the half bridge devices according to aspects of the present disclosure. There is a return cavity 136 for a side of each of the corresponding half bridge devices and each return path is connected allowing coolant to flow to the coolant outlet port 138.

Figure 29:
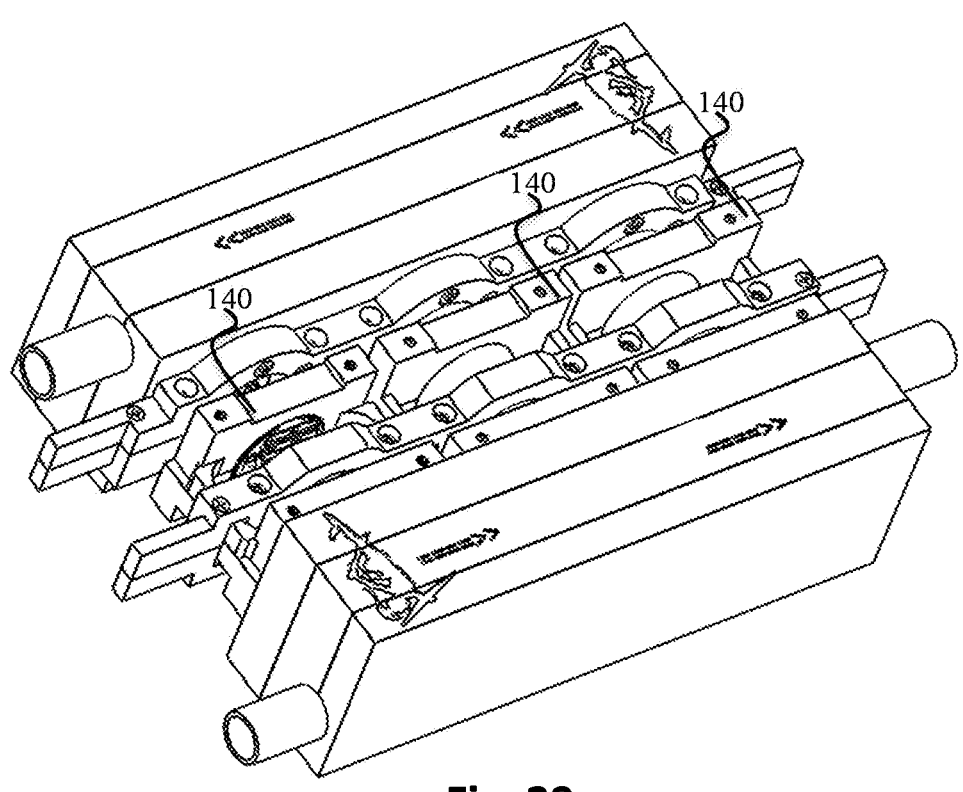
FIG. 29 is a diagram depicting a completed three-phase inverter assembly with motor phase power linkages installed according to aspects of the present disclosure.
Figure 30:
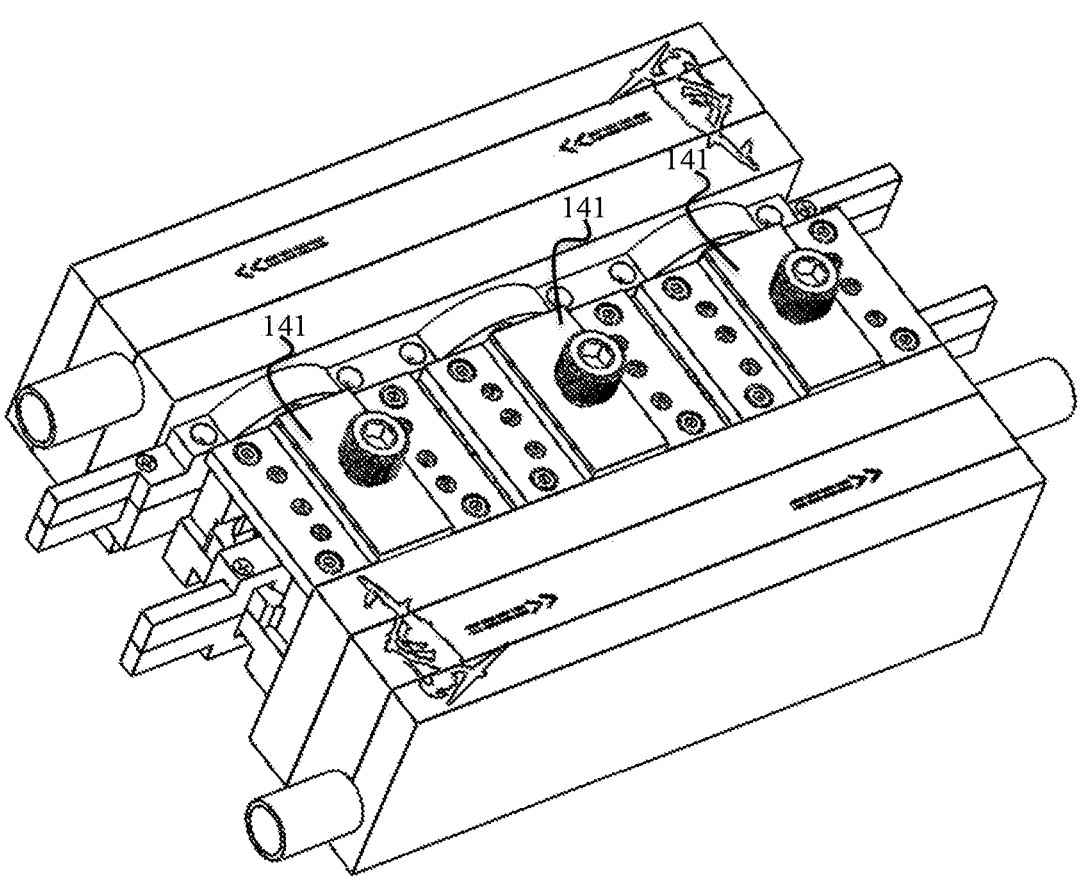
FIG. 30 depicts two coolant blocks mounted to the three-phase inverter having motor phase fasteners coupled to the motor phase power linkages according to aspects of the present disclosure.
Figure 31:
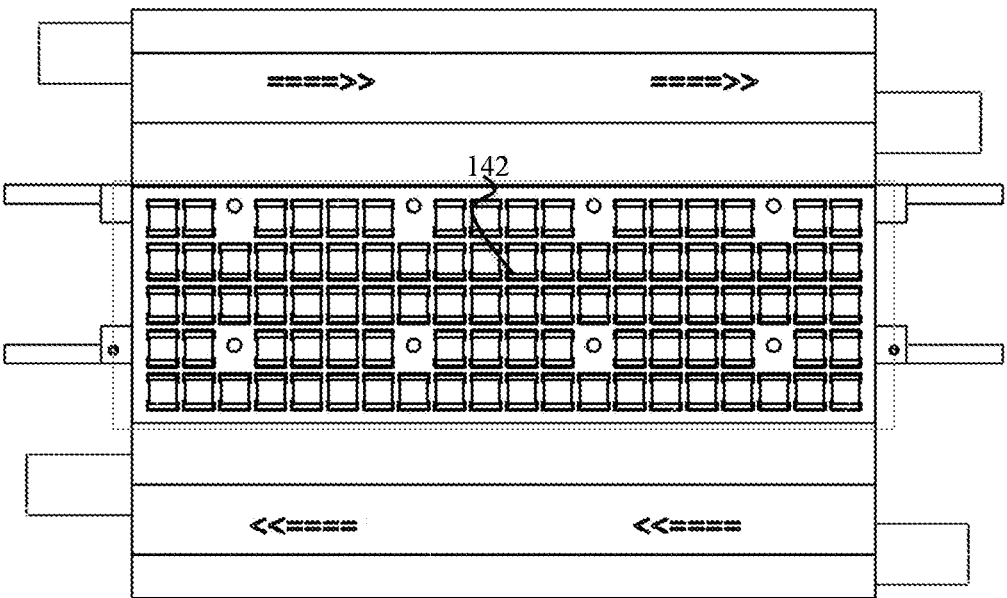
FIG. 31 shows integrated bulk capacitors and other passive circuitry that may be coupled to the three-phase inverter on a side opposite the motor phase fasteners according to aspects of the present disclosure.

FIG. 28 shows a three-phase inverter that utilizes two coolant blocks, with one mounted to each side of the three-phase power inverter and configured to cool a side of each of the three half bridge devices in the three-phase inverter. FIG. 29 depicts a completed three-phase inverter assembly with the motor phase power linkages installed 140. The motor phase power linkages 140 connect the drain and source of each half bridge device such that current only flows when one side of the half bridge device is in the on-state. FIG. 30 depicts two coolant blocks mounted to the three-phase inverter having motor phase fasteners 141 coupled to the motor phase power linkages 140. FIG. 31 shows integrated bulk capacitors and other passive circuitry 142 that may be coupled to the three-phase inverter on a side opposite the motor phase fasteners 141.

11                                                                                      12

Figure 32:
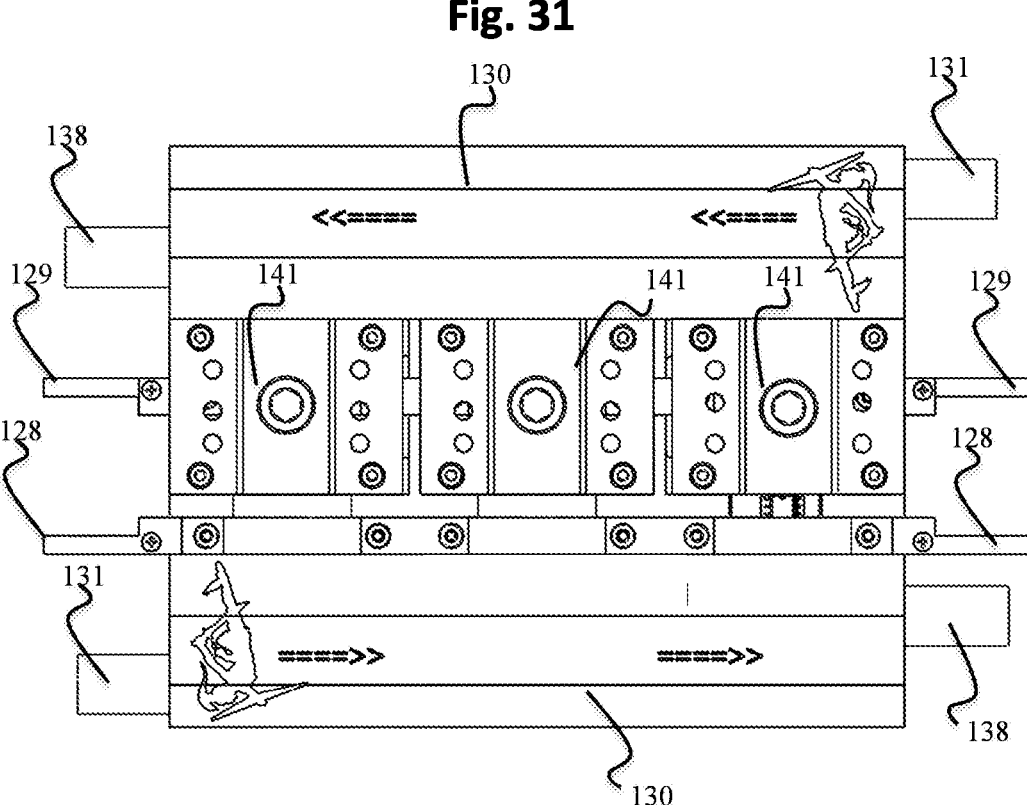
FIG. 32 depicts a top-down view of the completed three-phase inverter with cooling block according to aspects of the present disclosure.
Figure 33:
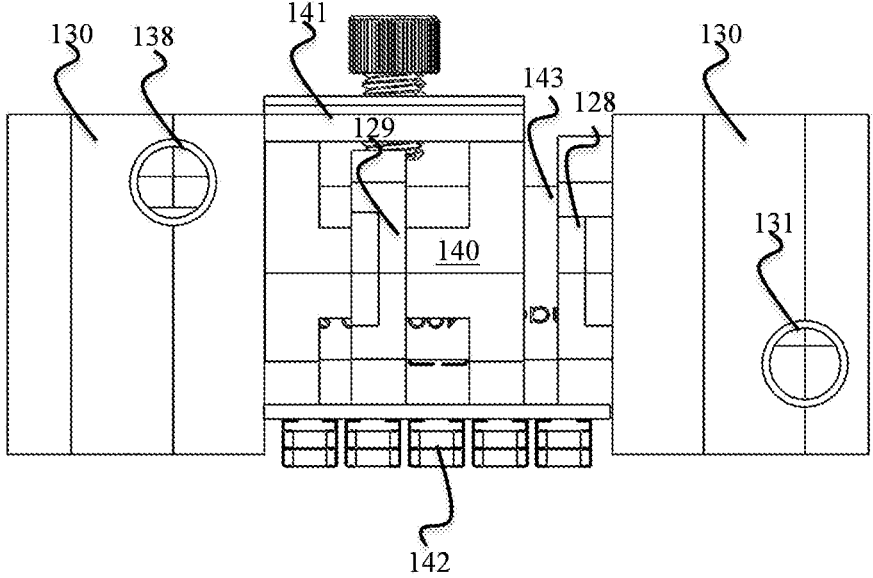
FIG. 33 shows a side view of the completed three-phase inverter with cooling block according to aspects of the present disclosure.

FIG. 32 depicts a top-down view of the completed three-phase inverter with cooling block according to aspects of the present disclosure. As shown the three-phase inverter includes motor phase fasteners 141, bus bars 129, 128, and the cooling blocks 130 include coolant inlet ports 131 and coolant outlet ports 138. FIG. 33 shows a side view of the completed three-phase inverter with cooling block according to aspects of the present disclosure. In the side view the motor phase power linkages 140, half bridge device 143 and passive circuitry 142 can also be seen.

According to additional aspects of the present disclosure the three-phase inverter device may be integrated into an electric vehicle for example an electric car, plane, helicopter, train, ship, or submarine.

Figure 34:
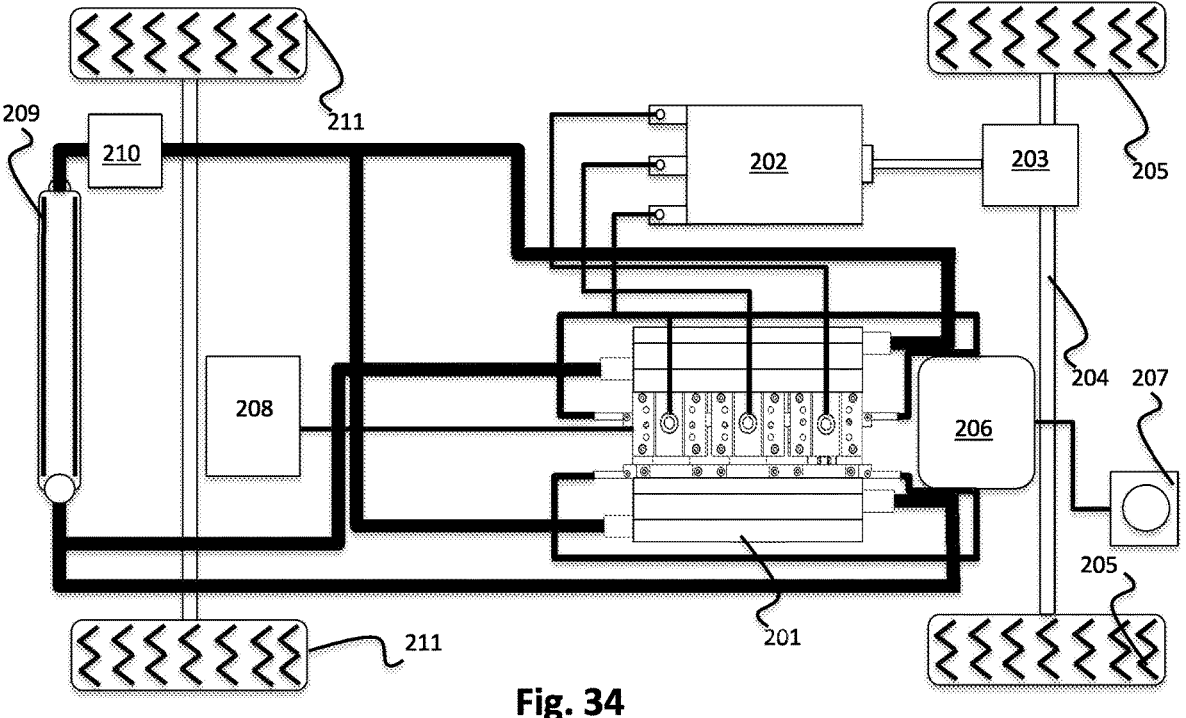
FIG. 34 depicts a simple electric car including the improved three-phase inverter according to aspects of the present disclosure.

FIG. 34 depicts a simple electric car including the three-phase inverter according to aspects of the present disclosure. As shown, the simple electric car may include the three-phase inverter and coolant block assembly 201 coupled to a three-phase electric motor 202. Each of the phases of the electric motor 202 may be conductively coupled to a motor phase fastener of the three-phase inverter 201. The output shaft of the electric motor 202 may be coupled to a differential (and optionally a gearbox) 203 configured to apply rotational velocity to the axel 204 connected the drive wheels 205. The three-phase inverter takes direct current (DC) electricity from a battery or other power source 206 and converts it to three-phase power which the electric motor 202 can turn into rotational velocity of its output shaft. A controller 208 may be coupled to the three-phase inverter and be configured to control the phases to operate the electric motor. The battery or other power source 206 may receive electricity from a charging circuit 207 which may receive electricity from an outside source such as AC electricity from a wall outlet. The charging circuit 207 may be for example an AC-to-DC converter and may utilize half bridge devices described in the present disclosure. The coolant blocks of the three-phase inverter may be coupled to a coolant system including a radiator 209 and coolant pump 210. For stability the electric car may also include additional wheels 211.

Figure 35:
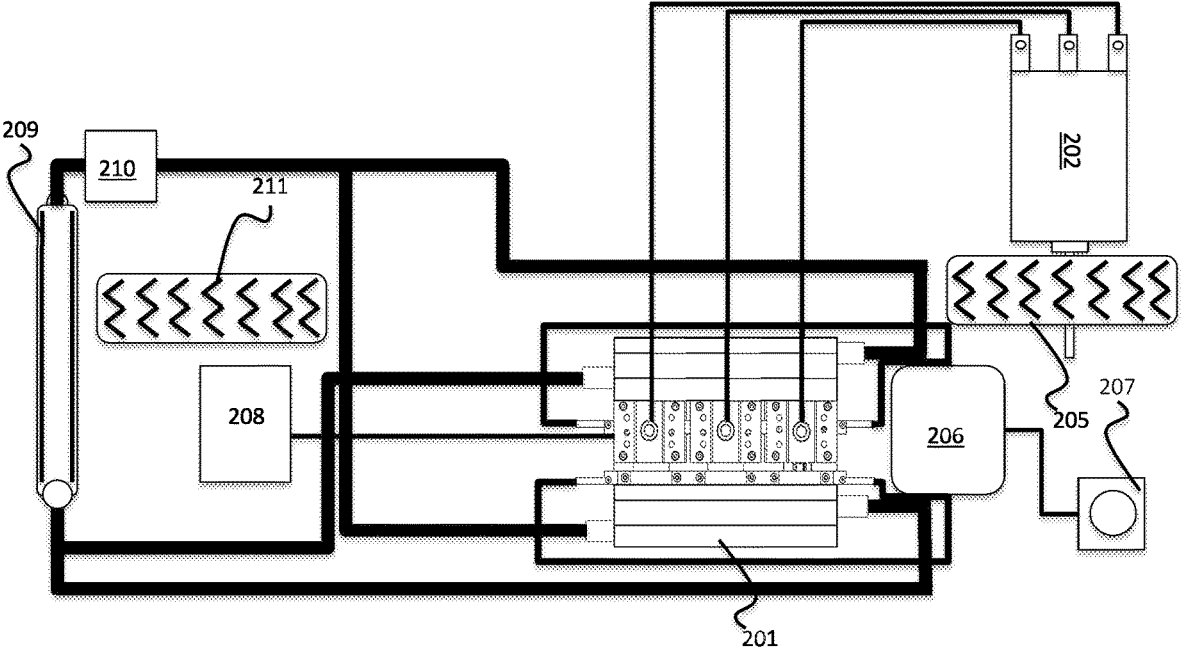
FIG. 35 is a layout diagram depicting a simple direct drive electrical vehicle using the improved three-phase inverter according to aspects of the present disclosure.

FIG. 35 depicts a simple direct drive electrical vehicle such as an electric motorcycle. Unlike the electrical car depicted in FIG. 34 the direct drive electrical vehicle omits a differential and instead the electric motor 202 directly drives the drive wheels 205. A direct drive electrical vehicle may include an electrical motor 202 and three-phase inverter 201 for each of the drive wheels 205 according to aspects of the present disclosure. A direct drive vehicle according to aspects of the present disclosure may include any number of drive wheels having corresponding electrical motors and inverters. According to some additional aspects of the present disclosure multiple electric motors may be coupled to a three-phase inverter.

Figure 36:
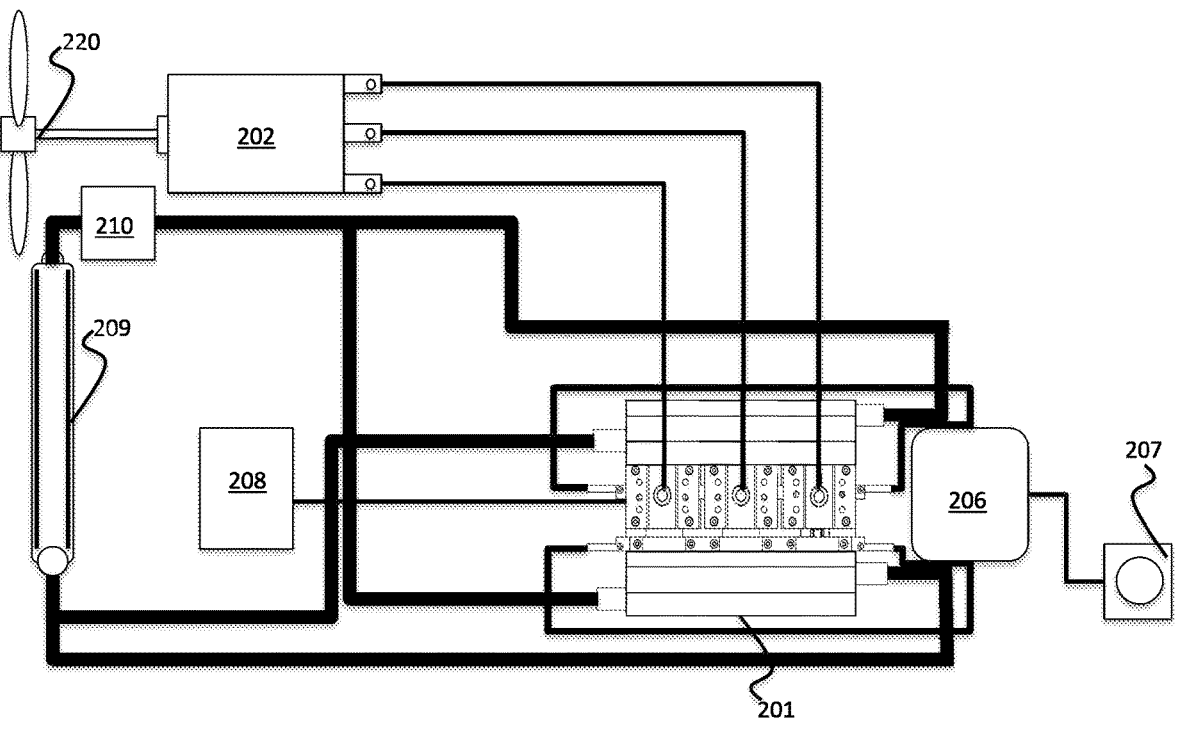
FIG. 36 is a layout diagram showing an alternative implementation of the direct drive electric vehicle using the improved three-phase inverter according to aspects of the present disclosure.

FIG. 36 shows an alternative embodiment of the direct drive electric vehicle. In the vehicle shown, the three-phase inverter 201 drives, an electric motor 202 connected to a propellor, liquid screw or other device use to generate thrust 220 through a liquid. This embodiment may be implemented many vehicles such as planes, boats, submarines, helicopters, quadcopters etc. In some implementation multiple electric motors 202 and inverters 201 may be included on the same coolant loop and share a radiator 209 and coolant pump 210.

Glossary

MOSFET: Metal Oxide Field Effect Transistor: A power Switch
IGBT: Insulated Gate Bipolar Transistor: A power Switch
$V_{ce(Sat)}$: Voltage Collector-Emitter when Saturated
RdsON: Resistance Drain Source ON state of a MOSFET transistor
PTI's: Power Traction Inverters
OEM: Original Equipment Manufacturer (i.e. a car brand/manufacturer)
DC: Direct Current
AC: Alternating Current
kW: Kilo Watt, 1000 Watts
MW: Mega Watts, 1000 kW
SAC305: A solder paste Sn(tin) Ag(Silver) Cu(Copper) respectively 97.3, 0.5% mixt
W/mK: Watts per meters (in 3 dimensions) per Kelvin, a measure of thermal impedance
IMS: Insulated Metal Substrate
Rth: Thermal Impedance
kV: Kilo Volts, 1000 Volts
SiC: Silicon Carbide, a technology used to produce transistors
mOhm: Milli Ohm, an Ohm divided by 1000.
Tj: Temperature Junction, the temperature of a silicon chip

What is claimed is:

1. A power device, comprising:
a first power electronics chip attached to a first copper substrate; and
a first diamond substrate attached to the first copper substrate, wherein the first copper substrate is sandwiched between a first side of the first diamond substrate and the first power electronics chip.

2. The device of claim 1, further comprising one or more pressure jets, each pressure jet being configured to direct pressurized coolant toward a second side of the first diamond substrate that is opposite the first side of the first diamond substrate.

3. The device of claim 2, wherein the one or more pressure jets include one or more pressure jets configured to deliver a perpendicular impact flow of coolant to the second side of the first diamond substrate.

4. The device of claim 1, wherein the first diamond substrate is a single crystal diamond (SCD) substrate.

5. The device of claim 1, wherein the first power electronics chip is a gallium nitride chip, a silicon carbide chip, or an insulated gate bipolar transistor silicon chip.

6. The device of claim 1, wherein the first power electronics chip includes one or more metal oxide semiconductor field effect transistor (MOSFET) devices.

7. The device of claim 6, wherein the one or more metal oxide semiconductor field effect transistor (MOSFET) devices include one or more Silicon Carbide (SiC) MOSFET devices.

8. The device of claim 7, wherein the one or more SiC MOSFET devices include three SiC MOSFET devices.

9. The device of claim 1 wherein a drain of the first power electronics chip is conductively coupled to the first copper substrate.

10. The device of claim 9 further comprising one or more conductive pillar structures coupled to the first copper substrate and conductively coupled to the drain of the first power electronics chip.

11. The device of claim 1 wherein the first power electronics chip includes a conductive source pad on a side of the first power electronics chip opposite the side of the first power electronics chip attached to the first copper substrate and conductively coupled to a source connection of the first power electronics chip.

12. The device of claim 11 further comprising a conductive clip coupled to the conductive source pad of the power electronics device wherein the conductive clip is conductively coupled to the source connection of the first power electronics chip.

13. The device of claim 12 wherein the conductive clip is conductively coupled and physically attached to the conductive source pad.

14. The device of claim 1 wherein the first power electronics chip includes a conductive gate pad on a side of the first power electronics chip opposite the side of the first power electronics chip attached to the first copper substrate and conductively coupled to a gate input of the first power electronics chip.

15. The device of claim 14 further comprising a gate router circuit conductively coupled to the gate pad of the first power electronics chip.

16. The device of claim 15 wherein the gate router circuit includes gate driver and current sense circuits.

17. The device of claim 15 wherein the gate router circuit includes a thin-flex printed circuit board.

18. The device of claim 1 further comprising a second power electronics chip attached to a second copper substrate and a second diamond substrate attached to the second copper substrate, wherein the second copper substrate is sandwiched between a first side of the second diamond substrate, and the power electronics chip wherein the second power electronics chip, second copper substrate, and second diamond substrate are arranged such that the first side of the first diamond substrate and the first side second diamond substrate are facing each other.

19. The device of claim 18 wherein the second power electronics chip is configured to operate anti-parallel with the first power electronics chip and the first and second power electronics chip form a first half bridge inverter.

20. The device of claim 19 further comprising a second half bridge inverter device conductively coupled to the first half bridge inverter forming a full H-Bridge inverter, wherein the second half bridge device is configured as set forth in claim 19.

21. The device of claim 19 further comprising two additional half bridge inverter devices conductively coupled to the first half bridge inverter forming a three-phase power inverter wherein the two additional half bridge devices are configured as set forth in claim 19.

22. The device of claim 21 further comprising at least one rigid conductive bus bar connecting the two additional Half bridge inverter devices and the first half bridge inverter.

23. A powered vehicle system comprising:
at least one half bridge device having a power electronics chip mounted to a copper substrate and the copper substrate sandwiched between the power electronics chip and a diamond substrate; and
a motor conductively coupled to the at least one half bridge device.

24. The powered vehicle system of claim 23 further comprising a wheel coupled to an output shaft of the motor wherein the output shaft of motor rotates the wheel.

25. The powered vehicle system of claim 23 further comprising a propeller coupled to an output shaft of the motor wherein the output shaft of the motor rotates the propeller and propeller is configured to generate thrust in a medium.

26. The powered vehicle system of claim 23 further comprising a differential coupled to an output shaft of the motor, wherein the differential is configured to deliver rotation from the output shaft of the motor to a differential output shaft.

27. The powered vehicle system of claim 25 further comprising at least one wheel attached to the differential output shaft wherein the differential output shafts delivers rotation to the wheel.

28. The powered vehicle system of claim 23 further comprising a gearbox coupled to the output shaft of the motor wherein in the gearbox is configured to convert a portion of rotational velocity the output shaft of the motor into torque.

29. The powered vehicle system of claim 23 further comprising at least one battery conductively coupled to the at least one half bridge device.

30. The powered vehicle system of claim 23 further comprising a controller communicatively coupled to the at least one half bridge device.

31. The powered vehicle system of claim 23 further comprising a cooling block coupled to the at least one half bridge device wherein the coolant block includes at least one pressure jet, each pressure jet being configured to direct pressurized coolant toward a side of the diamond substrate that is opposite the side of the diamond substrate that the copper substrate is attached.

32. The powered vehicle system of claim 31 wherein the at least one pressure jets include one or more pressure jets configured to deliver a perpendicular impact flow of coolant to the second side of the first diamond substrate.

33. The powered vehicle of claim 23 wherein the at least one half bridge device includes two half bridge devices operating as a full H-bridge.

34. The powered vehicle of claim 23 wherein the at least one half bridge device includes three half bridge devices operating as a three phase inverter.

* * * * *